(12) United States Patent
Takahashi et al.

(10) Patent No.: US 8,569,120 B2
(45) Date of Patent: Oct. 29, 2013

(54) METHOD FOR MANUFACTURING THIN FILM TRANSISTOR

(75) Inventors: Erika Takahashi, Kanagawa (JP);
Takayuki Kato, Kanagawa (JP);
Hidekazu Miyairi, Kanagawa (JP);
Yasuhiro Jinbo, Kanagawa (JP);
Mitsuhiro Ichijo, Kanagawa (JP);
Tomokazu Yokoi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 613 days.

(21) Appl. No.: 12/617,406

(22) Filed: Nov. 12, 2009

(65) Prior Publication Data
US 2010/0124804 A1   May 20, 2010

(30) Foreign Application Priority Data

Nov. 17, 2008   (JP) .................... 2008-293954

(51) Int. Cl.
*H01L 21/336*   (2006.01)
(52) U.S. Cl.
USPC ............................................ 438/158
(58) Field of Classification Search
USPC ............................................ 438/158
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |

(Continued)

FOREIGN PATENT DOCUMENTS

| | | |
|---|---|---|
| EP | 0535979 A2 | 4/1993 |
| JP | 57-071126 A | 5/1982 |

(Continued)

OTHER PUBLICATIONS

Kim.C et al., "A Novel Four-Mask-Count Process Architecture for TFT-LCDS,", SID Digest '00 : SID International Symposium Digest of Technical Papers, 2000, pp. 1006-1009.

(Continued)

*Primary Examiner* — Matthew W Such
*Assistant Examiner* — Robert Carpenter
(74) *Attorney, Agent, or Firm* — Nixon Peabody LLP; Jeffrey L. Costellia

(57) ABSTRACT

An object is to provide a method for manufacturing a thin film transistor having favorable electric characteristics, with high productivity. A gate electrode is formed over a substrate and a gate insulating layer is formed over the gate electrode. A first semiconductor layer is formed over the gate insulating layer by generating plasma using a deposition gas containing silicon or germanium, hydrogen, and a rare gas. Next, a second semiconductor layer including an amorphous semiconductor and a microcrystal semiconductor is formed in such a manner that the first semiconductor layer is partially grown as a seed crystal by generating plasma using a deposition gas containing silicon or germanium, hydrogen, and a gas containing nitrogen. Then, a semiconductor layer to which an impurity imparting one conductivity is added is formed and a conductive film is formed. Thus, a thin film transistor is manufactured.

36 Claims, 20 Drawing Sheets

(56) References Cited

U.S. PATENT DOCUMENTS

| | | | |
|---|---|---|---|
| 5,648,662 | A | 7/1997 | Zhang et al. |
| 5,677,236 | A | 10/1997 | Saitoh et al. |
| 5,701,167 | A | 12/1997 | Yamazaki |
| 5,766,989 | A | 6/1998 | Maegawa et al. |
| 5,849,601 | A | 12/1998 | Yamazaki |
| 5,859,445 | A | 1/1999 | Yamazaki |
| 5,864,150 | A | 1/1999 | Lin |
| 5,932,302 | A | 8/1999 | Yamazaki et al. |
| 6,011,277 | A | 1/2000 | Yamazaki |
| 6,023,075 | A | 2/2000 | Yamazaki |
| 6,153,893 | A | 11/2000 | Inoue et al. |
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,468,617 | B1 | 10/2002 | Yamazaki et al. |
| 6,468,839 | B2 | 10/2002 | Inoue et al. |
| 6,737,676 | B2 | 5/2004 | Yamazaki |
| 6,756,258 | B2 | 6/2004 | Zhang et al. |
| 6,835,523 | B1 | 12/2004 | Yamazaki et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,199,846 | B2 | 4/2007 | Lim |
| 7,211,454 | B2 | 5/2007 | Yamazaki et al. |
| 7,229,862 | B2 | 6/2007 | Yamazaki et al. |
| 8,049,215 | B2 | 11/2011 | Jinbo et al. |
| 8,053,294 | B2 | 11/2011 | Yamazaki et al. |
| 8,119,468 | B2 | 2/2012 | Miyairi et al. |
| 8,124,972 | B2 | 2/2012 | Dairiki et al. |
| 8,138,032 | B2 | 3/2012 | Miyairi et al. |
| 8,168,973 | B2 | 5/2012 | Yamazaki et al. |
| 2005/0012097 | A1 | 1/2005 | Yamazaki |
| 2005/0022864 | A1 | 2/2005 | Fujioka et al. |
| 2005/0115930 | A1 | 6/2005 | Tanaka et al. |
| 2007/0181945 | A1 | 8/2007 | Nakamura |
| 2008/0018229 | A1* | 1/2008 | Yamazaki ............ 313/498 |
| 2008/0308807 | A1 | 12/2008 | Yamazaki et al. |
| 2009/0033818 | A1 | 2/2009 | Nakajima et al. |
| 2009/0057683 | A1 | 3/2009 | Nakajima et al. |
| 2009/0061574 | A1 | 3/2009 | Nakajima et al. |
| 2009/0321737 | A1 | 12/2009 | Isa et al. |
| 2009/0321743 | A1 | 12/2009 | Isa et al. |
| 2010/0096637 | A1 | 4/2010 | Yamazaki et al. |

FOREIGN PATENT DOCUMENTS

| | | | |
|---|---|---|---|
| JP | 58-092217 | A | 6/1983 |
| JP | 59-072781 | A | 4/1984 |
| JP | 60-160170 | | 8/1985 |
| JP | 04-266019 | A | 9/1992 |
| JP | 05-129608 | A | 5/1993 |
| JP | 06-326312 | A | 11/1994 |
| JP | 07-131030 | A | 5/1995 |
| JP | 2000-277439 | A | 10/2000 |
| JP | 2001-007024 | A | 1/2001 |
| JP | 2001-053283 | A | 2/2001 |
| JP | 2004-014958 | A | 1/2004 |
| JP | 2005-049832 | A | 2/2005 |
| JP | 2005-167051 | A | 6/2005 |
| JP | 2005-191546 | A | 7/2005 |
| JP | 2008-124392 | | 5/2008 |
| JP | 2008-124392 | A | 5/2008 |
| WO | WO-2004/086487 | A1 | 10/2004 |

OTHER PUBLICATIONS

Arai.T et al., "41.2: Micro Silicon Technology for Active Matrix OLED Display,", SID Digest '07 : SID International Symposium Digest of Technical Papers, 2007, vol. XXXVIII, pp. 1370-1373.

Fujiwara.H et al., "Stress-Induced Nucleation of Microcrystalline Silicon From Amorphous Phase,", Jpn, J. Appl. Phys. (Japanese Journal of Applied Physics) , May 1, 2002, vol. 41, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics) , Mar. 1, 1998, vol. 37/Part2, No. 3A, pp. L265-L268.

Lee,C et al., "Directly Deposited Nanocrystalline Silicon Thin-Film Transistors With Ultra High Mobilities,", Appl. Phys. Lett,. (Applied Physics Letters) , Dec. 18, 2006, vol. 89, pp. 252101-1-252101-3.

Song.J et al., "34.1: Advanced Four-Mask Process Architecture for the A-SI TFT Array Manufacturing Method,", SID Digest '02 : SID International Symposium Digest of Technical Papers, 2002, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International.Symposium Digest of Technical Papers, 2005, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters) , May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Lee.O et al., "How to Achieve High Mobility Thin Film Transistors by Direct Deposition of Silicon Using 13.56 Mhz RF PECVD?,", IEDM, 2006, pp. 295-298.

Esmaeili-Rad.M et al., "High Stability, Low Leakage Nanocrystalline Silicon Bottom Gate Thin Film Transistors for AMOLED Displays,", IEEE IEDM, 2006, pp. 303-306.

Lee.H et al., "Leakage Current Mechanisms in Top-Gate Nanocrystalline Silicon Thin-Film Transistors,", Appl. Phys. Lett. (Applied Physics Letters) , Feb. 28, 2008, vol. 92, pp.083509-1-083509-3.

Lee.O et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTS Using 13.56Mhz PECVD Microcrystalline Silicon,", IEEE Electron Device Letters, Sep. 5, 2005, vol. 26, No. 9, pp. 637-639.

Lee. C et al., "Postdeposition Thermal Annealing and Material Stability of 75° C Hydrogenated Nanocrystalline Silicon Plasma-Enhanced Chemical Vapor Deposition Films ,", J. Appl, Phys. (Journal of Applied Physics) , Aug. 4, 2005, vol. 98, pp. 034305-1-034305.

Fujiwara.H et al., "Microcrystalline silicon nucleation sites in the sub-surface of hydrogenated amorphous silicon,", Surface Science, 2002, vol. 497, pp. 333-340.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

Invitation to pay additional fees (application No. PCT/JP2009/061795;PCT11623/12200/12401), International Searching Authority, dated July 28, 2009.

* cited by examiner

FIG. 4A1
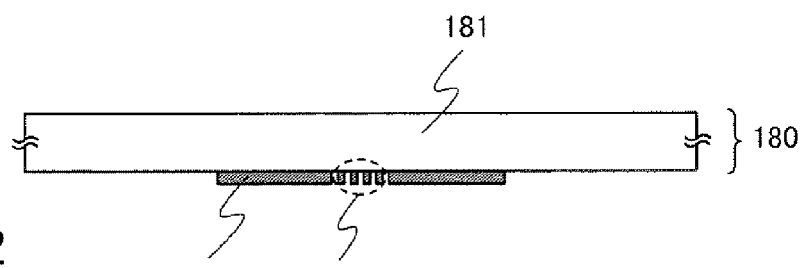
FIG. 4A2
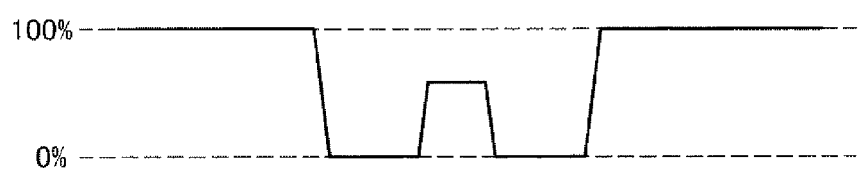
FIG. 4B1
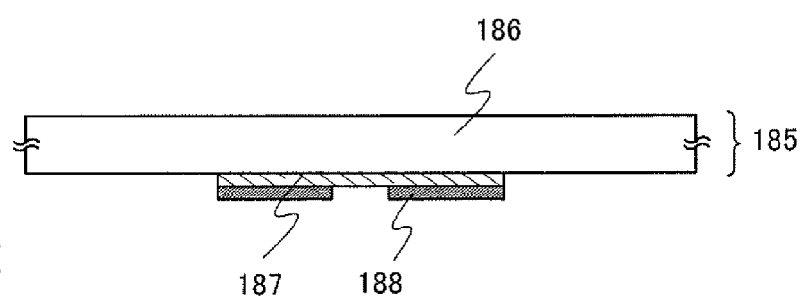
FIG. 4B2
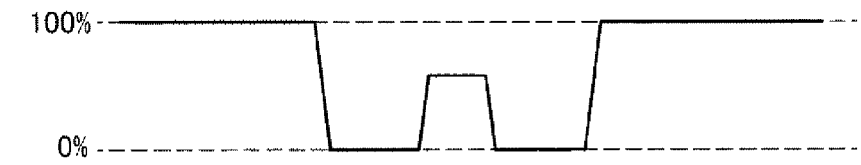

○ SiH$_4$=10sccm, × SiH$_4$=20sccm, △ SiH$_4$=30sccm

METHOD FOR MANUFACTURING THIN FILM TRANSISTOR

BACKGROUND OF THE INVENTION

1. Field of the Invention

The present invention relates to a method for manufacturing a thin film transistor and a display device to which the thin film transistor is applied.

2. Description of the Related Art

As a kind of field-effect transistor, a thin film transistor in which a channel region is formed in a semiconductor layer formed over a substrate having an insulating surface is known. Techniques for using amorphous silicon, microcrystalline silicon, and polycrystalline silicon for semiconductor layers in thin film transistors have been disclosed (see Patent Documents 1 to 5). A typical application of thin film transistors is a liquid crystal television device, in which thin film transistors have been put to practical use as a switching transistor for each pixel that constitutes a display screen.

PATENT DOCUMENTS

[Patent Document 1] Japanese Published Patent Application No. 2001-053283
[Patent Document 2] Japanese Published Patent Application No. 05-129608
[Patent Document 3] Japanese Published Patent Application No. 2005-049832
[Patent Document 4] Japanese Published Patent Application No. 07-131030
[Patent Document 5] Japanese Published Patent Application No. 2005-191546

SUMMARY OF THE INVENTION

A thin film transistor in which a channel is formed using an amorphous silicon layer has problems such as low field-effect mobility and small on-current. On the other hand, a thin film transistor in which a channel is formed using a microcrystalline silicon layer has a problem in that, whereas the field-effect mobility is higher than that of the thin film transistor in which a channel is formed using an amorphous silicon layer, the off-current is large, and thus sufficient switching characteristics cannot be obtained.

A thin film transistor in which a polycrystalline silicon layer is used for a channel formation region has characteristics such as much higher field-effect mobility and larger on-current than the above-described two types of thin film transistors. Because of such characteristics, this thin film transistor can be used not only as a switching transistor provided in a pixel but also in a driver circuit for which high-speed operation is required.

However, a thin film transistor formed using a polycrystalline silicon layer requires a crystallization process of a semiconductor layer and has a problem of higher manufacturing cost as compared to a thin film transistor formed using an amorphous silicon layer. For example, with the laser annealing technique involved in the process of manufacturing a polycrystalline silicon layer, large-screen liquid crystal panels cannot be produced efficiently because the irradiation area of a laser beam is small.

A glass substrate for manufacturing display panels has been grown in size year by year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm). In the future, the size of the glass substrate is expected to grow to the 9th generation (2400 mm×2800 mm or 2450 mm×3050 mm) and the 10th generation (2950 mm×3400 mm). An increase in size of glass substrate is based on the concept of minimum cost design.

On the other hand, a technique with which a thin film transistor capable of high-speed operation can be manufactured with high productivity over a large-area mother glass substrate like that of the 10th generation (2950 mm×3400 mm) has not been established yet, which is a problem in industry.

Therefore, an object is to provide a method for manufacturing a thin film transistor which has favorable electric characteristics, with high productivity.

A gate electrode is formed over a substrate and a gate insulating layer is formed over the gate electrode. Then, a first semiconductor layer is formed to a thickness of 3 nm to 10 nm, preferably 3 nm to 5 nm, over the gate insulating layer by generating plasma using a deposition gas containing silicon or germanium, hydrogen, and a rare gas such as helium, argon, neon, krypton, or xenon.

Next, a second semiconductor layer having a plurality of conical or pyramidal projections formed using a microcrystalline semiconductor is formed in such a manner that part of the first semiconductor layer is grown as a seed crystal by generating plasma using a deposition gas containing silicon or germanium, hydrogen, and a gas containing nitrogen.

Then, a semiconductor layer to which an impurity imparting one conductivity is added (hereinafter referred to as an impurity semiconductor layer) is formed and a conductive layer is formed, whereby a thin film transistor is manufactured.

As the first semiconductor layer, a microcrystalline semiconductor layer is formed. The second semiconductor layer, in which the first semiconductor layer is included, includes the microcrystalline semiconductor layer in contact with the gate insulating layer and a layer including a microcrystalline semiconductor and an amorphous semiconductor in contact with the microcrystalline semiconductor layer. Further, the second semiconductor layer may include an amorphous semiconductor layer in contact with the layer including a microcrystalline semiconductor and an amorphous semiconductor. Note that the microcrystalline semiconductor layer in contact with the gate insulating layer includes the first semiconductor layer and the microcrystalline semiconductor layer in which part of the first semiconductor layer is grown as a seed crystal.

The microcrystalline semiconductor layer included in the second semiconductor layer serves as a channel formation region of a thin film transistor and the amorphous semiconductor layer serves as a high-resistance region. The impurity semiconductor layer serves as source and drain regions of the thin film transistor and the conductive layer serves as a wiring.

As a source gas of the first semiconductor layer, a rare gas such as helium, argon, neon, krypton, or xenon is used, whereby plasma is stabilized, dissociation of the deposition gas containing silicon or germanium and hydrogen is promoted, and the amount of active species is increased. Therefore, reaction between the active species is promoted and the deposition rate of the first semiconductor layer is increased. Further, as the deposition rate is increased, the deposition time of the first semiconductor layer becomes short and the amount of impurities taken in a treatment chamber during deposition is reduced. Therefore, the amount of impurities included in the first semiconductor layer is reduced, whereby crystallinity of the first semiconductor layer is increased. Accordingly, on-current and field-effect mobility of the thin film transistor can be increased.

Further, a gas containing nitrogen such as ammonia, nitrogen, nitrogen fluoride, or nitrogen chloride is used to form the second semiconductor layer together with the deposition gas containing silicon or germanium and hydrogen, whereby the layer including a microcrystalline semiconductor and an amorphous semiconductor, which includes a plurality of conical or pyramidal projections formed of a microcrystalline semiconductor, can be formed. Furthermore, an amorphous semiconductor layer containing nitrogen may be formed on the layer including a microcrystalline semiconductor and an amorphous semiconductor. Therefore, regions in contact with source and drain regions and a back channel side are each formed using an amorphous semiconductor layer with high resistance, whereas between the channel formation region and the source and drain regions, a plurality of conical or pyramidal projections is formed of the microcrystalline semiconductor which has low resistance, so that off-current can be reduced, and further, on-current is increased by reducing resistance between the source and drain regions and the channel formation region. In addition, the threshold voltage can be controlled with the use of a gas containing nitrogen as the source gas of the second semiconductor layer.

Note that a rare gas such as helium, argon, neon, krypton, or xenon, is used as the source gas of the second semiconductor layer, so that the deposition rate can be increased.

Accordingly, a thin film transistor in which off-current is small, on-current is large, and the threshold voltage is controlled can be manufactured with high productivity.

BRIEF DESCRIPTION OF THE DRAWINGS

In the accompanying drawings:
FIGS. 4A1, 4A2, 4B1, and 4B2 are drawings explaining multi-tone masks applicable to a method for manufacturing a thin film transistor.

DETAILED DESCRIPTION OF THE INVENTION

Figure 1A:
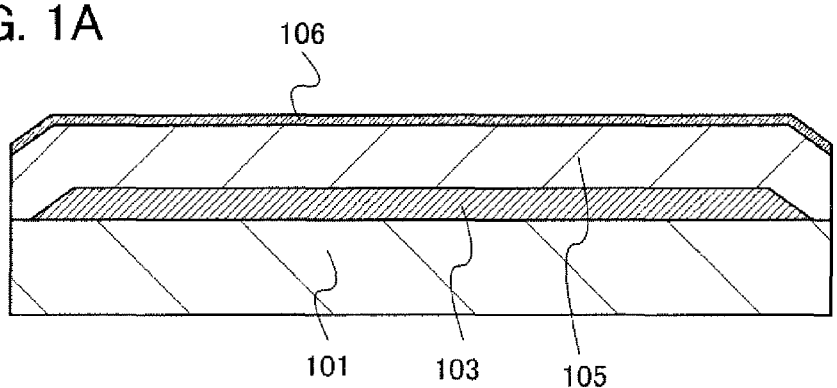
FIGS. 1A to 1C are cross-sectional views explaining a method for manufacturing a thin film transistor.

Embodiments and Examples disclosed hereinafter are described in detail with reference to the drawings. Note that the disclosed invention is not limited to the following description because it will be easily understood by those skilled in the art that various changes and modifications can be made without departing from the spirit and scope of the disclosed invention. Therefore, this invention is not interpreted as being limited to the description of Embodiments below. Note that in structures of the present invention described hereinafter, the same portions or portions having similar functions are denoted by the same reference numerals in different drawings, and description thereof is not repeated.

Embodiment 1

In Embodiment 1, a method for manufacturing a thin film transistor is described with reference to FIGS. 1A to 1C, FIGS. 2A and 2B, FIG. 3, FIGS. 4A1, 4A2, 4B1, and 4B2, FIGS. 5A to 5C, FIG. 6, FIG. 7, FIG. 8, and FIG. 9. An n-channel thin film transistor has higher carrier mobility than a p-channel thin film transistor. In addition, it is preferable that all thin film transistors formed over the same substrate have the same conductivity to reduce the number of manufacturing steps. Therefore, in Embodiment 1, a method for manufacturing an n-channel thin film transistor is described.

A gate electrode 103 is formed over a substrate 101. Then, a gate insulating layer 105 is formed so as to cover the gate electrode 103. A first semiconductor layer 106 is formed over the gate insulating layer 105 (see FIG. 1A).

As the substrate 101, a glass substrate, a ceramic substrate, a plastic substrate which has high heat resistance enough to withstand a process temperature of this manufacturing process, or the like can be used. In the case where a substrate does not need a light-transmitting property, a substrate in which an insulating layer is provided over a surface of a substrate of a metal such as a stainless steel alloy may be used. As a glass substrate, an alkali-free glass substrate formed using barium borosilicate glass, aluminoborosilicate glass, aluminosilicate glass, or the like may be used.

The gate electrode 103 can be formed in a single layer or a stacked layer using a metal material such as molybdenum, titanium, chromium, tantalum, tungsten, aluminum, copper, neodymium, or scandium or an alloy material which contains any of these materials as its main component. Alternatively, a semiconductor layer typified by polycrystalline silicon doped with an impurity such as phosphorus, or an AgPdCu alloy may be used.

The gate electrode 103 can be formed in such a manner that a conductive layer is formed over the substrate 101 by a sputtering method or a vacuum evaporation method using the above material, a mask is formed over the conductive layer by a photolithography method, an ink-jet method, or the like, and the conductive layer is etched using the mask. In the photolithography process, a resist may be applied over an entire surface of a substrate. Alternatively, after printing a resist on a region where a resist mask is formed by a printing method, light-exposure is performed, whereby the amount of the resist can be saved, leading to cost reduction.

Alternatively, the gate electrode 103 can be formed by discharging a conductive nanopaste of silver, gold, copper, or the like over the substrate by an ink-jet method and baking the conductive nanopaste. Note that a nitride layer of any of the above metal materials may be provided between the substrate 101 and the gate electrode 103 in order to improve adhesion between the gate electrode 103 and the substrate 101. Here, a conductive layer is formed over the substrate 101 and etched using a first resist mask formed using a photomask.

Note that side surfaces of the gate electrode 103 are preferably tapered. This is for prevention of disconnection at a step portion, because a semiconductor layer and a wiring layer are to be formed over the gate electrode 103 in a later process. In order to form the side surfaces of the gate electrode 103 into a tapered shape, etching may be performed while the resist mask is made to recede.

Through the process of forming the gate electrode 103, a gate wiring (a scan line) and a capacitor wiring can also be formed at the same time. Note that a scan line refers to a wiring for selecting a pixel, and a capacitor wiring refers to a wiring connected to one electrode of a storage capacitor in a pixel. However, without limitation thereto, the gate electrode 103 and either or both a gate wiring and a capacitor wiring may be formed separately.

The gate insulating layer 105 can be formed in a single layer or a stacked layer using a silicon oxide layer, a silicon nitride layer, a silicon oxynitride layer, or a silicon nitride oxide layer. By forming the gate insulating layer 105 using a silicon oxide layer or a silicon oxynitride layer, fluctuation in the threshold voltage of the thin film transistor can be suppressed.

Further, the gate insulating layer 105 can be formed by a CVD method, a sputtering method, or the like. Furthermore, the gate insulating layer 105 may be formed using a microwave plasma CVD apparatus with a high frequency (1 GHz or more). When the gate insulating layer 105 is formed using a microwave plasma CVD apparatus with a high frequency, the withstand voltage between the gate electrode and drain and source electrodes can be improved; therefore, a highly reliable thin film transistor can be obtained. Further, a silicon oxide layer is formed as the gate insulating layer 105 by a CVD method using an organosilane gas, whereby the amount of hydrogen contained in the gate insulating layer can be reduced and fluctuation in the threshold voltage of the thin film transistor can be reduced. As the organosilane gas, the following compound containing silicon can be used: tetraethoxysilane (TEOS: $Si(OC_2H_5)_4$ tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like.

The first semiconductor layer 106 is formed over the gate insulating layer 105. The first semiconductor layer 106 is formed using a microcrystalline semiconductor layer typified by a microcrystalline silicon layer, a microcrystalline germanium layer, and a microcrystalline silicon germanium layer. The first semiconductor layer 106 is formed with a thickness of 3 nm to 10 nm, preferably 3 nm to 5 nm, so that in a second semiconductor layer to be formed in a later process, the length of a plurality of conical or pyramidal projections formed using a microcrystalline semiconductor can be controlled.

In a treatment chamber of a plasma CVD apparatus, a deposition gas containing silicon or germanium is mixed with hydrogen and a rare gas, and the first semiconductor layer 106 is formed by glow discharge plasma. Typically, a deposition gas containing silicon or germanium is mixed with hydrogen and a rare gas selected from helium, neon, argon, xenon, and krypton, and the first semiconductor layer 106 is formed by glow discharge plasma. Microcrystalline silicon, microcrystalline silicon germanium, microcrystalline germanium, or the like is formed using a mixed gas which is obtained by diluting the deposition gas containing silicon or germanium with hydrogen whose flow rate is 10 to 2000 times, preferably 10 to 200 times that of the deposition gas.

As typical examples of the deposition gas containing silicon or germanium, $SiH_4$, $Si_2H_6$, $GeH_4$, and $Ge_2H_6$ are given. As the rare gas, one or more of helium, neon, argon, xenon, or krypton can be used.

As a source gas of the first semiconductor layer 106, a rare gas such as helium, argon, neon, krypton, xenon, or the like is used, whereby plasma is stabilized, dissociation of the deposition gas containing silicon or germanium and hydrogen is promoted, and the amount of active species is increased. Therefore, reaction between the active species is promoted, and the deposition rate of the first semiconductor layer is increased. Further, the deposition rate is increased, impurities are hard to be taken in the treatment chamber in deposition of the first semiconductor layer 106; therefore, the amount of the impurities contained in the first semiconductor layer 106 is decreased and crystallinity of the first semiconductor layer 106 is increased. Accordingly, on-current and field-effect mobility of the thin film transistor are increased and productivity of the thin film transistor can also be increased.

When the first semiconductor layer 106 is formed, glow discharge plasma is generated by applying high frequency power of 3 MHz to 30 MHz, typically, high frequency power of 13.56 MHz or 27.12 MHz in the HF band, or high frequency power of approximately 30 MHz to 300 MHz in the VHF band, typically 60 MHz. Alternatively, glow discharge plasma is generated by applying high frequency power at a microwave frequency of 1 GHz or more. With the use of high frequency power in the VHF band or at a microwave frequency, the deposition rate can be increased. In addition, high frequency power in the HF band is superimposed with high frequency power in the VHF band, whereby unevenness of plasma in a large-sized substrate is also reduced, the uniformity can be increased, and the deposition rate can be increased.

Note that before the first semiconductor layer 106 is formed, impurities in the treatment chamber of the CVD apparatus are removed by introducing the deposition gas containing silicon or germanium while the pressure in the treatment chamber is reduced, so that impurities at the interface between the gate insulating layer 105 and the first semiconductor layer 106 of the thin film transistor, which are to be formed in a later process, can be reduced and thus, electric characteristics of the thin film transistor can be improved.

Figure 1B:
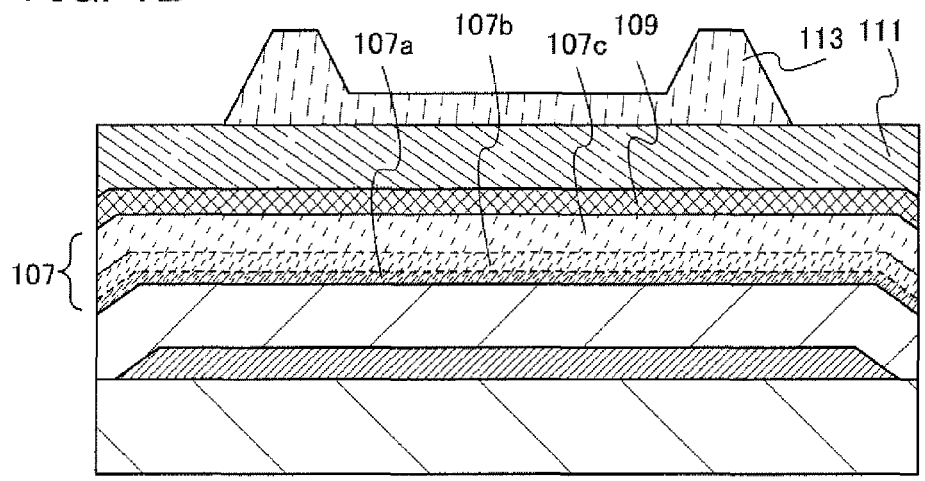
Figure 1C:
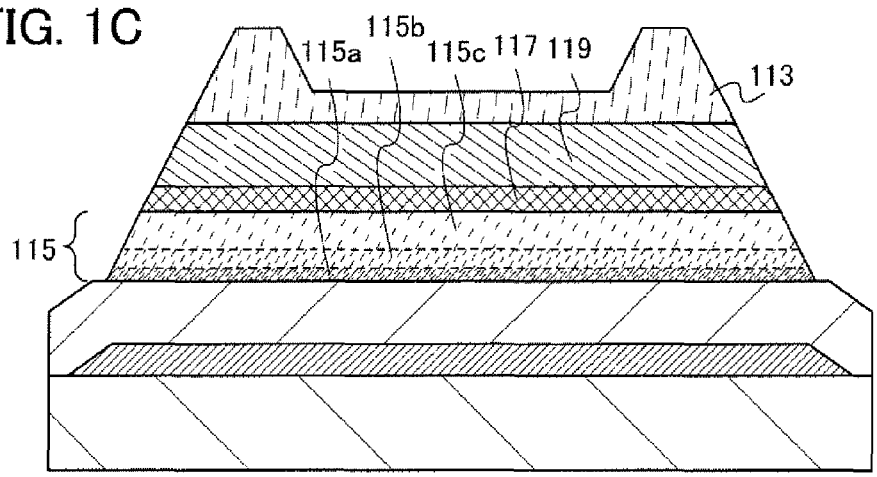

Next, as illustrated in FIG. 1B, another semiconductor layer is deposited over the first semiconductor layer 106 so as to form a second semiconductor layer 107, an impurity semiconductor layer 109 is formed over the second semiconductor layer 107, and a conductive layer 111 is formed over the impurity semiconductor layer 109. Then, a second resist mask 113 is formed over the conductive layer 111 (see FIG. 1B). Here, the second semiconductor layer 107 is formed under a condition that part of the first semiconductor layer 106 is grown as a seed crystal. In the treatment chamber of the plasma CVD apparatus, a deposition gas containing silicon or germanium is mixed with hydrogen and a gas containing nitrogen, and the second semiconductor layer 107 is formed by glow discharge plasma. As examples of the gas containing nitrogen, ammonia, nitrogen, nitrogen fluoride, nitrogen chloride, and the like can be given; however, without limitation thereto, any of gases containing nitrogen can be used.

In this case, a flow ratio between the deposition gas containing silicon or germanium and hydrogen is the same as that of the first semiconductor layer 106, in which a microcrystalline semiconductor layer is formed, and the source gas containing nitrogen is used, whereby crystal growth can be reduced than that of the first semiconductor layer 106. Note that as the deposition condition of the second semiconductor layer 107, although the flow ratio between the deposition gas containing silicon or germanium and hydrogen is a normal condition in which an amorphous semiconductor layer is formed and a gas containing nitrogen is used, it is difficult to form a layer 107b including a microcrystalline semiconductor and an amorphous semiconductor in the second semiconductor layer 107, which is not preferable.

Here, as a typical example of a condition for forming the microcrystalline semiconductor layer, the flow rate of hydrogen is 10 to 2000 times, preferably 50 to 200 times that of the deposition gas containing silicon or germanium. Note that in a typical example of a normal condition for forming an amorphous semiconductor layer, the flow rate of hydrogen is 0 to 5 times that of the deposition gas containing silicon or germanium.

As the source gas of the second semiconductor layer 107, a rare gas such as helium, neon, argon, xenon, or krypton is introduced, whereby the deposition rate can be increased.

At an early stage of the deposition of the second semiconductor layer 107, a microcrystalline semiconductor layer is deposited over the entire surface of the first semiconductor layer 106 using the first semiconductor layer 106 as a seed crystal (the early stage of the deposition). Then, crystal growth is partially controlled and a conical or pyramidal microcrystalline semiconductor region grows (the middle stage of the deposition). Further, crystal growth in the conical or pyramidal microcrystalline semiconductor region is controlled, so that an amorphous semiconductor layer is formed (the late stage of the deposition).

Figure 2A:
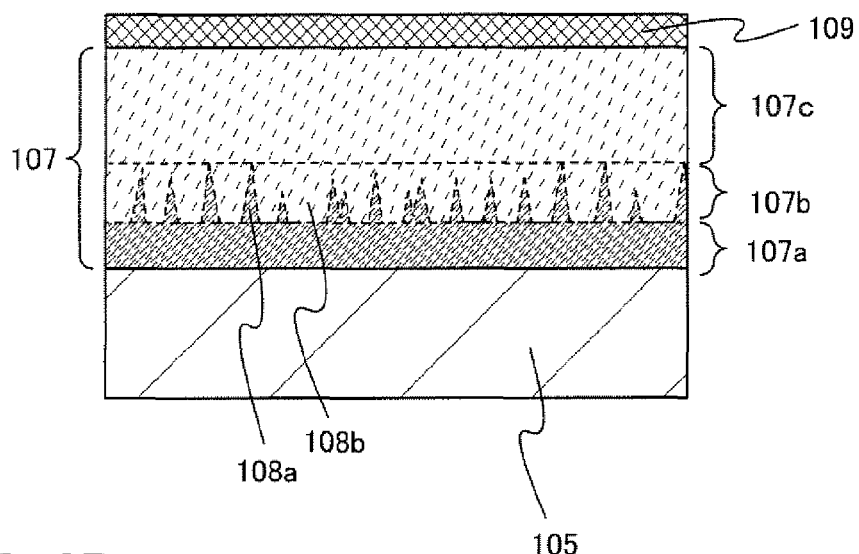
FIGS. 2A and 2B are cross-sectional views explaining a method for manufacturing the thin film transistor.

Accordingly, in the second semiconductor layer 107 illustrated in each FIG. 1B and FIG. 2A, a microcrystalline semiconductor layer 107a in contact with the gate insulating layer 105 corresponds to the first semiconductor layer 106 and the microcrystalline semiconductor layer formed in the early stage of the deposition of the second semiconductor layer 107.

Further, in the second semiconductor layer 107 illustrated in each FIG. 1B and FIG. 2A, the layer 107b including a microcrystalline semiconductor and an amorphous semiconductor corresponds to a conical or pyramidal microcrystalline semiconductor region 108a formed at the middle stage of the deposition of the second semiconductor layer 107 and an amorphous semiconductor layer 108b which fills a space between the conical or pyramidal microcrystalline semiconductor regions 108a.

In the second semiconductor layer 107 illustrated in each FIG. 1B and FIG. 2A, an amorphous semiconductor layer 107c corresponds to an amorphous semiconductor layer formed at the late stage of the deposition of the second semiconductor layer 107.

The microcrystalline semiconductor layer 107a is formed using a semiconductor having an intermediate structure between amorphous and crystalline structures (including a single crystal and a polycrystal). A microcrystalline semiconductor is a semiconductor having a third state that is stable in terms of free energy and is a crystalline semiconductor having short-range order and lattice distortion, in which columnar, conical, or pyramidal crystals having a grain size of from 2 nm to 200 nm, preferably from 10 nm to 80 nm, more preferably from 20 nm to 50 nm have grown in a normal direction with respect to a substrate surface. Therefore, a crystal grain boundary is formed at the interface of the columnar, conical, or pyramidal crystals in some cases.

A Raman spectrum of microcrystalline silicon, which is a typical example of a microcrystalline semiconductor, shifts to the lower wavenumber side than 520 $cm^{-1}$ which represents single crystal silicon. That is, a peak of a Raman spectrum of microcrystalline silicon lies between 520 $cm^{-1}$ which represents single crystal silicon, and 480 $cm^{-1}$ which represents amorphous silicon. Furthermore, hydrogen or halogen is included at 1 at. % or more in order to terminate dangling bonds. Moreover, the microcrystalline semiconductor may contain a rare gas element such as helium, argon, krypton, or neon so as to further promote lattice distortion, so that stability is increased and a favorable microcrystalline semiconductor can be obtained. Such a microcrystalline semiconductor is disclosed in, for example, U.S. Pat. No. 4,409,134.

Further, the concentrations of oxygen and nitrogen included in the microcrystalline semiconductor layer 107a, which are measured by secondary ion mass spectrometry, are less than $1 \times 10^{18}$ atoms/$cm^3$, which is preferable since the crystallinity of the microcrystalline semiconductor layer 107a can be increased.

The amorphous semiconductor layer 107c includes a semiconductor layer including nitrogen and an amorphous semiconductor or a semiconductor layer including an NH group and an amorphous semiconductor. Here, as source gases for depositing the semiconductor layer including nitrogen and an amorphous semiconductor or the semiconductor layer including an NH group and an amorphous semiconductor, the flow ratio between the deposition gas containing silicon or germanium and hydrogen is the same as that of the first semiconductor layer 106, in which a microcrystalline semiconductor layer is formed, and a gas containing nitrogen is further used, whereby the amorphous semiconductor layer 107c has lower energy at an Urbach edge measured by CPM or low-temperature PL, (photoluminescence), as compared to a normal amorphous semiconductor layer including nitrogen or amorphous semiconductor layer including an NH group. Further, the tail of the level in the band gap has a steep slope. That is, the amorphous semiconductor layer 107c has few defects and a well-ordered crystal structure as compared to a normal amorphous semiconductor layer including nitrogen or amorphous semiconductor layer including an NH group.

When the amorphous semiconductor layer 107c is formed using a semiconductor layer including nitrogen and amorphous silicon, preferably a semiconductor layer including an NH group and amorphous silicon, the slope of a band tail of a band gap is steeper as compared to the band tail of the band gap of amorphous silicon, the band gap gets wider, and tunneling current does not easily flow. Accordingly, off-current of the thin film transistor can be reduced. In addition, the shift amount of the threshold voltage of the thin film transistor to be formed in a later process can be reduced.

As illustrated in FIG. 2A, the layer 107b including a microcrystalline semiconductor and an amorphous semiconductor is provided between the microcrystalline semiconductor layer 107a and the amorphous semiconductor layer 107c. In addition, the layer 107b including a microcrystalline semiconductor and an amorphous semiconductor includes the microcrystalline semiconductor region 108a and the amorphous semiconductor layer 108b which fills a space between the microcrystalline semiconductor regions 108a. In particular, the layer 107b including a microcrystalline semiconductor and an amorphous semiconductor includes the microcrystalline semiconductor region 108a which is extended to form projections from the microcrystalline semiconductor layer 107a and the amorphous semiconductor layer 108b which is formed using the same amorphous semiconductor as the amorphous semiconductor layer 107c.

The amorphous semiconductor layer 107c is formed using an amorphous semiconductor layer including nitrogen or an NH group, which has low electric conductivity and high resistivity, so that off-current of the thin film transistor can be reduced. Further, since the layer 107b including a microcrystalline semiconductor and an amorphous semiconductor includes the conical or pyramidal microcrystalline semiconductor region 108a, resistance in a longitudinal direction (a film thickness direction) when voltage is applied to a source or drain region, that is, resistance between the second semiconductor layer 107 and the source or drain region can be reduced, whereby on-current of the thin film transistor can be increased.

Figure 2B:
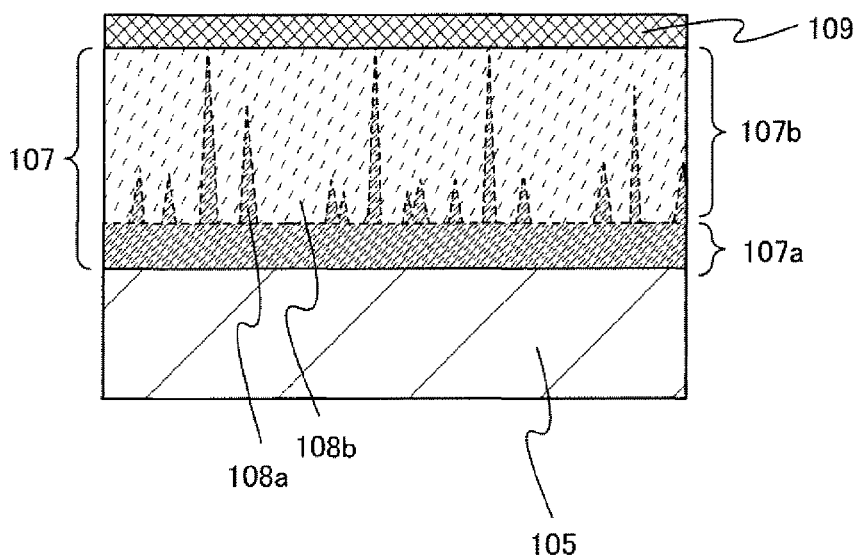

As illustrated in FIG. 2B, the layer 107b including a microcrystalline semiconductor and an amorphous semiconductor is provided between the microcrystalline semiconductor layer 107a and the impurity semiconductor layer 109. In some cases, the amorphous semiconductor layer 107c is not formed between the layer 107b including a microcrystalline semiconductor and an amorphous semiconductor, and the impurity semiconductor layer 109. In such a structure illustrated in FIG. 2B, it is preferable that the proportion of the microcrystalline semiconductor region 108a be lower than that of the amorphous semiconductor layer 1081b. Accordingly, off-current of the thin film transistor can be reduced. Further, in the layer 107b including a microcrystalline semiconductor and an amorphous semiconductor, resistance in a longitudinal direction (a film thickness direction) when voltage is applied to a source or drain region, that is, resistance between the second semiconductor layer 107 and the source or drain region can be reduced, whereby on-current of the thin film transistor can be increased.

The microcrystalline semiconductor region 108a is a microcrystalline semiconductor having a projection in which the width thereof is gradually decreased from a gate insulating layer 105 side to an amorphous semiconductor layer 107c side. Note that the microcrystalline semiconductor region 108a may have a projection in which the width thereof is gradually increased from the gate insulating layer 105 side to the amorphous semiconductor layer 107c side.

In the layer 107b including a microcrystalline semiconductor and an amorphous semiconductor, when the microcrystalline semiconductor region 108a has a crystal grain whose width is gradually decreased from the gate insulating layer 105 side to the amorphous semiconductor layer 107c side, a proportion of the microcrystalline semiconductor region is higher in the microcrystalline semiconductor layer 107a side as compared to the amorphous semiconductor layer 107c side. Although the microcrystalline region 108a grows from a surface of the microcrystalline semiconductor layer 107a in a film thickness direction, when the flow rate of hydrogen to silane in the source gas is low or a concentration of the source gas including nitrogen is high, growth of the crystal grain of the microcrystalline semiconductor region 108a is suppressed, the crystal grain is made to have a conical or pyramidal shape, and eventually, only an amorphous semiconductor layer is deposited.

Further, the layer 107b including a microcrystalline semiconductor and an amorphous semiconductor preferably includes nitrogen, typically an NH group. This is because nitrogen, typically an NH group, is coupled to dangling bonds of silicon atoms at the interface of the crystal grain included in the microcrystalline semiconductor region 108a, and at the interface between the microcrystalline semiconductor region 108a and the amorphous semiconductor region 108b, so that defects are reduced and carriers easily flow. Therefore, a concentration of nitrogen, preferably a concentration of an NH group, is set to $1\times10^{20}$ cm$^{-3}$ or more to $1\times10^{21}$ cm$^{-3}$ or less, preferably $2\times10^{20}$ cm$^{-3}$ or more to $1\times10^{21}$ cm$^{-3}$ or less, whereby dangling bonds of silicon atoms are easily cross-linked with nitrogen, preferably with an NH group. Therefore, carriers easily flow. As a result, a bonding which promotes the carrier transfer is formed in a crystal grain boundary or a defect, whereby the mobility of the layer 107b including a microcrystalline semiconductor and an amorphous semiconductor is increased. That is, field-effect mobility of the thin film transistor is increased.

Further, by reducing the oxygen concentration in the layer 107b including a microcrystalline semiconductor and an amorphous semiconductor, bonding which interrupts the carrier transfer in defects at the interface between the crystal grain and the amorphous semiconductor layer and at the interface between the microcrystal grains can be reduced.

Note that here, the microcrystalline semiconductor layer 107a refers to a region having approximately constant thickness. Further, the interface between the microcrystalline semiconductor layer 107a and the layer 107b including a microcrystalline semiconductor and an amorphous semiconductor refers to a region where the region closest to the gate insulating layer 105 is extended in a plain portion of the interface between the microcrystalline semiconductor region 108a and the amorphous semiconductor layer 108b.

The total thickness of the microcrystalline semiconductor layer 107a and the layer 107b including a microcrystalline semiconductor and an amorphous semiconductor, that is, the distance between the interface of the gate insulating layer 105 and the apex of the projection of the layer 107b including a microcrystalline semiconductor and an amorphous semiconductor is 3 nm to 80 nm inclusive, preferably 5 nm to 30 nm inclusive, whereby off-current of the TFT can be reduced.

As the source gas of the second semiconductor layer 107, a gas containing nitrogen is used together with the deposition gas containing silicon or germanium and hydrogen, so that crystallinity and amorphousness of the layer 107b including a microcrystalline semiconductor and an amorphous semiconductor and the amorphous semiconductor layer 107c can be controlled. Therefore, the shift amount of the threshold voltage of the thin film transistor can be reduced.

Note that when a rare gas such as helium, neon, argon, xenon, or krypton is introduced as the source gas of the second semiconductor layer 107, the crystallinity of the second semiconductor layer 107 is increased and off-current of the thin film transistor is increased; therefore, mixing ratio of the deposition gas including silicon or germanium, hydrogen, and a gas containing nitrogen is preferably controlled. Typically, the amount of the deposition gas containing silicon or germanium is increased with respect to that of hydrogen which increases amorphousness, whereby the crystallinity and amorphousness of the layer 107b including a microcrystalline semiconductor and an amorphous semiconductor and the amorphous semiconductor layer 107c can be controlled.

In the treatment chamber of the plasma CVD apparatus, a deposition gas containing silicon or germanium, hydrogen, and phosphine (diluted with hydrogen or silane) are mixed and the impurity semiconductor layer 109 is formed by glow discharge plasma. The deposition gas containing silicon or germanium is diluted with hydrogen, and amorphous silicon to which phosphorus is added, microcrystalline silicon to which phosphorus is added, amorphous silicon germanium to which phosphorus is added, microcrystalline silicon germanium to which phosphorus is added, amorphous germanium to which phosphorus is added, microcrystalline germanium to which phosphorus is added, or the like is formed.

Further, a rare gas such as helium, neon, argon, xenon, or krypton may be introduced into the source gas of the impurity semiconductor layer 109 so as to increase the deposition rate.

Note that when the second semiconductor layer 107 and source and drain electrodes 125 to be formed in a later process forms an ohmic contact, the impurity semiconductor layer 109 is not necessarily formed.

A series of steps from a step of forming the gate insulating layer 105 to a step of forming the impurity semiconductor layer is described with reference to a time chart illustrated in FIG. 3. Note that the gate insulating layer 105 is formed by stacking a silicon oxynitride layer over a silicon nitride layer.

Figure 3:
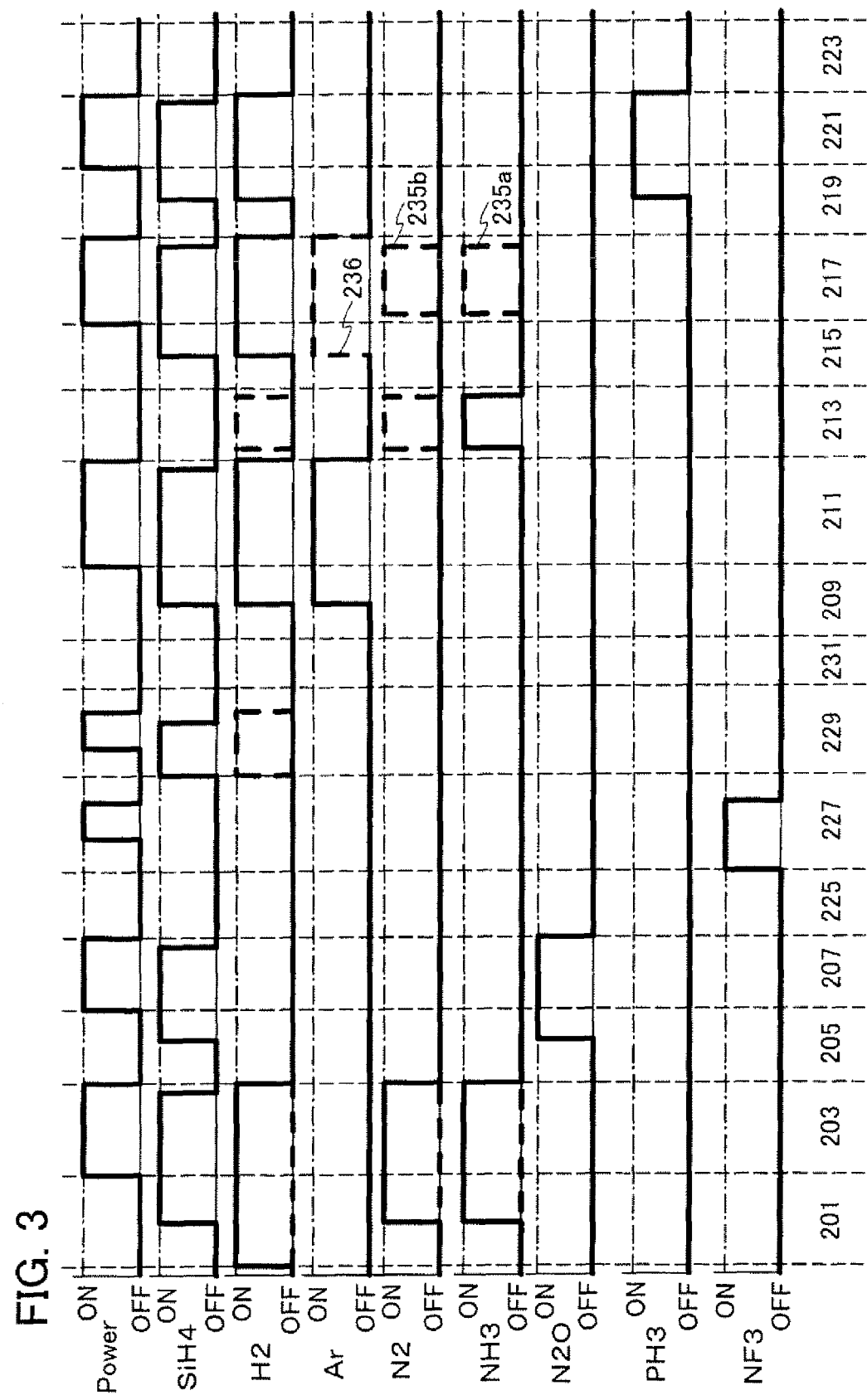
FIG. 3 is an example of a time chart explaining a process of manufacturing a thin film transistor.

First, the substrate over which the gate electrode 103 is formed is heated in a treatment chamber 241 of the CVD apparatus to be described in Embodiment 2, and source gases used for depositing a silicon nitride layer are introduced into the treatment chamber 241 (pretreatment 201 in FIG. 3). Here, as an example, $SiH_4$, $H_2$, $N_2$, and $NH_3$ are introduced as source gases at flow rates of 40 sccm, 500 sccm, 550 sccm, and 140 sccm, respectively, and are stabilized; further, the pressure in the treatment chamber is set to 100 Pa, the substrate temperature is set to 280° C., and plasma discharge is performed at output of 370 W, whereby a silicon nitride layer with a thickness of approximately 110 nm is formed. After that, only the supply of $SiH_4$ is stopped, and after several seconds, the plasma discharge is stopped (formation of SiN 203 in FIG. 3). This is because if plasma discharge is stopped in a state where $SiH_4$ is present in the treatment chamber, grains or particles containing silicon as its main component are formed, which causes reduction in yield.

Next, the source gases used for depositing the silicon nitride layer are exhausted and source gases used for depositing a silicon oxynitride layer are introduced into the treatment chamber 241 (replacement of gases 205 in FIG. 3). Here, as an example, $SiH_4$ and $N_2O$ are introduced as source gases at flow rates of 30 sccm and 1200 sccm, respectively, and are stabilized; further, the pressure in the treatment chamber is set to 40 Pa, the substrate temperature is set to 280° C., and plasma discharge is performed at output of 50 W, whereby a silicon oxynitride layer with a thickness of approximately 110 nm is formed. After that, in a manner similar to the formation of the silicon nitride layer, only the supply of $SiH_4$ is stopped, and after several seconds, the plasma discharge is stopped (formation of SiON 207 in FIG. 3).

Through the above process, the gate insulating layer 105 can be formed. After formation of the gate insulating layer 105, the substrate 101 is carried out of the treatment chamber 241 (unload 225 in FIG. 3).

The substrate 101 is carried out of the treatment chamber 241, and then, for example, an $NF_3$ gas is introduced into the treatment chamber 241 and the inside of the treatment chamber 241 is cleaned (cleaning treatment 227 in FIG. 3). After that, treatment for forming an amorphous silicon layer in the treatment chamber 241 is performed (precoating treatment 229 in FIG. 3). By this treatment, the amorphous silicon layer is formed on the inner wall of the treatment chamber 241. After that, the substrate 101 is carried into the treatment chamber 241 (load 231 in FIG. 3).

Next, source gases used for depositing the first semiconductor layer 106 are introduced into the treatment chamber 241 (replacement of gases 209 in FIG. 3). Then, the first semiconductor layer 106 is formed over the entire surface of the gate insulating layer 105. Here, as an example, $SiH_4$, $H_2$, and Ar are introduced as source gases at flow rates of 10 sccm, 1500 sccm, and 1500 sccm, respectively, and are stabilized; further, the pressure in the treatment chamber is set to 280 Pa, the substrate temperature is set to 280° C., and plasma discharge is performed at output of 50 W, whereby a microcrystalline silicon layer with a thickness of approximately 5 nm is formed as the first semiconductor layer 106. After that, in a manner similar to the formation of the silicon nitride layer or the like described above, only the supply of $SiH_4$ is stopped, and after several seconds, the plasma discharge is stopped (formation of first semiconductor layer 211 in FIG. 3).

Next, nitrogen is supplied to a surface of the first semiconductor layer 106. Here, the surface of the first semiconductor layer 106 is exposed to ammonia, whereby nitrogen is supplied (here, referred to as "flush treatment") (flush treatment 213 in FIG. 3). Further, hydrogen may be included in ammonia. Alternatively, a nitrogen gas may be introduced into the treatment chamber 241 instead of ammonia. Further alternatively, ammonia and a nitrogen gas may be introduced into the treatment chamber 241. Here, as an example, it is preferable that the pressure in the treatment chamber 241 be approximately 20 Pa to 30 Pa, the substrate temperature be 280° C., and the treatment time be 60 seconds. Note that in the treatment of this process, the substrate 101 is exposed only to ammonia; however, plasma treatment may also be performed. After that, these gases are exhausted and gases used for depositing the second semiconductor layer 107 are introduced (replacement of gases 215 in FIG. 3).

Next, the second semiconductor layer 107 is formed. Here, the second semiconductor layer 107 is formed using an amorphous semiconductor layer including nitrogen. Here, as an example, $SiH_4$, $H_2$, and 1000 ppm of ammonia (diluted with hydrogen) are introduced as source gases at flow rates of 30 sccm, 1425 sccm, and 25 sccm, respectively, and are stabilized; further, the pressure in the treatment chamber is set to 280 Pa, the substrate temperature is set to 280° C., and plasma discharge is performed using an RF power source frequency of 13.56 MHz and power of an RF power source of 50 W, whereby the second semiconductor layer 107 with a thickness of approximately 150 nm is formed. Here, the second semiconductor layer 107 can be formed by forming a microcrystalline silicon layer as the microcrystalline semiconductor layer 107a, a layer including microcrystalline silicon and amorphous silicon including an NH group as the layer 107b including microcrystalline semiconductor and an amorphous semiconductor, and an amorphous silicon layer containing nitrogen as the amorphous semiconductor layer 107c. Note that nitrogen may be included in the microcrystalline silicon in the layer 107b including a microcrystalline semiconductor and an amorphous semiconductor.

In the formation process of the second semiconductor layer 107, ammonia which is introduced into the treatment chamber by the flush treatment is decomposed by plasma discharge, so that an NH group is generated. Further, when the second semiconductor layer 107 is stacked, dangling bonds can be cross-linked. Note that in the case where a nitrogen gas is introduced into the treatment chamber as a gas including nitrogen, reaction occurs between the nitrogen gas and a hydrogen gas which is a source gas of the second semiconductor layer 107 by plasma discharge, so that an NH group is generated. Further, different dangling bonds in the second semiconductor layer 107 are cross-linked with the NH group.

After that, in a manner similar to the formation of the silicon nitride layer or the like described above, only the supply of SiH$_4$ is stopped, and after several seconds, the plasma discharge is stopped (formation of second semiconductor layer 217 in FIG. 3). After that, these gases are exhausted and gases used for depositing the impurity semiconductor layer 109 are introduced (replacement of gases 219 in FIG. 3).

In the treatment chamber where the second semiconductor layer 107 of Embodiment 1 is formed, a gas including nitrogen is supplied. The gas containing nitrogen is subjected to plasma discharge, so that an NH group is generated. As described above, dangling bonds included in the second semiconductor layer 107 are cross-linked with an NH group. Therefore, in the treatment chamber to which the gas including nitrogen is supplied, the amorphous semiconductor layer 107c including an NH group with which dangling bonds are cross-linked can be formed.

In the second semiconductor layer 107 formed by such a method, the nitrogen concentration which is measured by secondary ion mass spectrometry has a peak at the interface between the microcrystalline semiconductor layer 107a and the layer 107b including a microcrystalline semiconductor and an amorphous semiconductor and is reduced in a direction in which the layer 107b including a microcrystalline semiconductor and an amorphous semiconductor and the amorphous semiconductor layer 107c are deposited.

Note that as indicated by a dashed line 235a in FIG. 3, ammonia may be supplied to the treatment chamber in formation of second semiconductor layer 217. Instead of ammonia, as indicated by a dashed line 235b, a nitrogen gas may be supplied. Further alternatively, both ammonia and a nitrogen gas may be supplied to the treatment chamber. As a result, the nitrogen concentration of the second semiconductor layer 107 is increased, so that dangling bonds included in the second semiconductor layer 107 are cross-linked, leading to reduction in the defect levels.

In the second semiconductor layer 107 formed by such a method, the nitrogen concentration which is measured by secondary ion mass spectrometry has a peak at the microcrystalline semiconductor layer 107a, or the interface between the microcrystalline semiconductor layer 107a and the layer 107b including a microcrystalline semiconductor and an amorphous semiconductor and is constant in a direction in which the layer 107b including a microcrystalline semiconductor and an amorphous semiconductor and the amorphous semiconductor layer 107c are deposited.

Alternatively, in the formation of second semiconductor layer 217, a rare gas may be used as the source gas as indicated by a dashed line 236. As a result, the growth rate of the second semiconductor layer 107 can be increased.

Next, the impurity semiconductor layer 109 is formed over the entire surface of the second semiconductor layer 107. In a later process, the impurity semiconductor layer 109 is patterned into source and drain regions 127. First, source gases used for depositing the impurity semiconductor layer 109 are introduced into the treatment chamber 241. Here, as an example, SiH$_4$ and a mixed gas in which PH$_3$ is diluted with H$_2$ to 0.5 vol % are introduced as source gases at flow rates of 100 sccm and 170 sccm, respectively, and are stabilized. The pressure in the treatment chamber 241 is set to 280 Pa, the substrate temperature is set to 280° C., and plasma discharge is performed at output of 60 W, whereby an amorphous silicon layer including phosphorus can be formed with a thickness of approximately 50 nm. After that, in a manner similar to the formation of the silicon nitride layer or the like described above, only the supply of SiH$_4$ is stopped, and after several seconds, the plasma discharge is stopped (formation of impurity semiconductor layer 221 in FIG. 3). After that, these gases are exhausted (exhaust of gas 223 in FIG. 3).

As described above, the formation up to the impurity semiconductor layer 109 can be performed.

The conductive layer 111 can be formed in a single layer or a stacked layer of aluminum, copper, titanium, neodymium, scandium, molybdenum, chromium, tantalum, tungsten, or the like. Alternatively, an aluminum alloy to which an element to prevent a hillock is added (typically an aluminum-neodymium alloy which can be used for the gate electrode 103 or the like) may be used. Further alternatively, crystalline silicon to which an impurity serving as a donor is added may be used. The conductive layer 111 may have a stacked structure in which a layer on a side in contact with the crystalline silicon to which an impurity serving as a donor is added is formed using titanium, tantalum, molybdenum, tungsten, or nitride of any of these elements and aluminum or an aluminum alloy is formed thereover. Further, the conductive layer 111 may have a stacked structure in which aluminum or an aluminum alloy is sandwiched with titanium, tantalum, molybdenum, tungsten, or nitride of any of these elements. For example, the conductive layer 111 preferably has a stacked structure in which an aluminum layer is sandwiched between titanium nitride layers.

The conductive layer 111 is formed by a CVD method, a sputtering method, or a vacuum evaporation method. Alternatively, the conductive layer 111 may be formed by discharging a conductive nanopaste of silver, gold, copper, or the like by a screen printing method, an ink-jet method, or the like and baking the conductive nanopaste.

The second resist mask 113 has regions with different thicknesses. Such a resist mask can be formed using a multi-tone mask. The multi-tone mask is used, so that the number of photomasks to be used and the number of manufacturing process are reduced, which is preferable. In Embodiment 1, the multi-tone mask can be used in a process of forming a pattern of the second semiconductor layer 107 and a process of dividing the source region and the drain region.

A multi-tone mask is a mask capable of light exposure with multi-level tight intensity, and typically, light exposure is performed with three levels of light intensity to provide an exposed region, a semi-exposed region, and an unexposed region. With the use of a multi-tone mask, one-time exposure and development process allow a resist mask with plural thicknesses (typically, two kinds of thicknesses) to be formed. Thus, the use of a multi-tone mask can reduce the number of photomasks.

FIGS. 4A1 and 4B1 are cross-sectional views of typical multi-tone masks. FIG. 4A1 illustrates a gray-tone mask 180 and FIG. 4B1 illustrates a half-tone mask 185.

The gray-tone mask 180 illustrated in FIG. 4A1 includes a light-blocking portion 182 formed using a light-blocking layer, and a diffraction grating portion 183 provided with a pattern of the light-blocking layer, on a light-transmitting substrate 181.

The diffraction grating portion 183 has slits, dots, meshes, or the like that are provided at intervals which are less than or equal to the resolution limit of light used for the exposure, whereby the light transmittance can be controlled. Note that the slits, dots, or mesh may be provided in the diffraction grating portion 183 in periodic intervals or non-periodic intervals.

As the light transmitting substrate 181, quartz or the like can be used. The light-blocking layers forming the light-blocking portion 182 and the diffraction grating portion 183 may be formed using a metal, and chromium, chromium oxide, or the like is preferably used.

When the gray-tone mask 180 is irradiated with light for exposure, the transmittance of a region which overlaps with the light-blocking portion 182 is 0% as shown in FIG. 4A2 and the transmittance of a region which is not provided with the light-blocking portion 182 or the diffraction grating portion 183 is 100%. Further, the transmittance at the diffraction grating portion 183 is approximately in the range of 10% to 70%, which can be adjusted by the intervals of slits, dots, or meshes of the diffraction grating, or the like.

The half-tone mask 185 illustrated in FIG. 4B1 includes a light-blocking portion 188 formed using a light-blocking layer and a semi-light-transmitting portion 187 formed using a semi-light-transmitting layer on a light-transmitting substrate 186 having a light-transmitting property.

The semi-light-transmitting portion 187 can be formed using a layer of MoSiN, MoSi, MoSiO, MoSiON, CrSi, or the like. The light-shielding portion 188 may be formed using a metal similar to the light-shielding layer of the gray-tone mask, and chromium, chromium oxide, or the like is preferably used.

When the half-tone mask 185 is irradiated with light for exposure, the transmittance of a region which overlaps with the light-blocking portion 188 is 0% as shown in FIG. 4B2 and the transmittance of a region which is not provided with the light-blocking portion 188 or the semi-light-transmitting portion 187 is 100%. Further, the transmittance at the semi-light-transmitting portion 187 is approximately in the range of 10% to 70%, which can be adjusted by the kind, the thickness, or the like of the material to be used.

By light exposure using the multi-tone mask and development, a resist mask which includes regions with different thicknesses can be formed.

Next, with the use of the second resist mask 113, the second semiconductor layer 107, the impurity semiconductor layer 109, and the conductive layer 111 are etched. Through this process, the second semiconductor layer 107, the impurity semiconductor layer 109, and the conductive layer 111 are divided into each element to form a second semiconductor layer 115, an impurity semiconductor layer 117, and a conductive layer 119. Note that the second semiconductor layer 115 includes a microcrystalline semiconductor layer 115a, a layer 115b including a microcrystalline semiconductor and an amorphous semiconductor, and an amorphous semiconductor layer 115c (see FIG. 1C).

Next, the second resist mask 113 is made to recede to form divided third resist masks 123. Ashing using oxygen plasma may be performed in order that the resist mask is made to recede. Here, ashing is performed on the second resist mask 113 so that the resist mask 113 is divided over the gate electrode. Accordingly, the third resist masks 123 can be formed (see FIG. 5A).

Figure 5A:
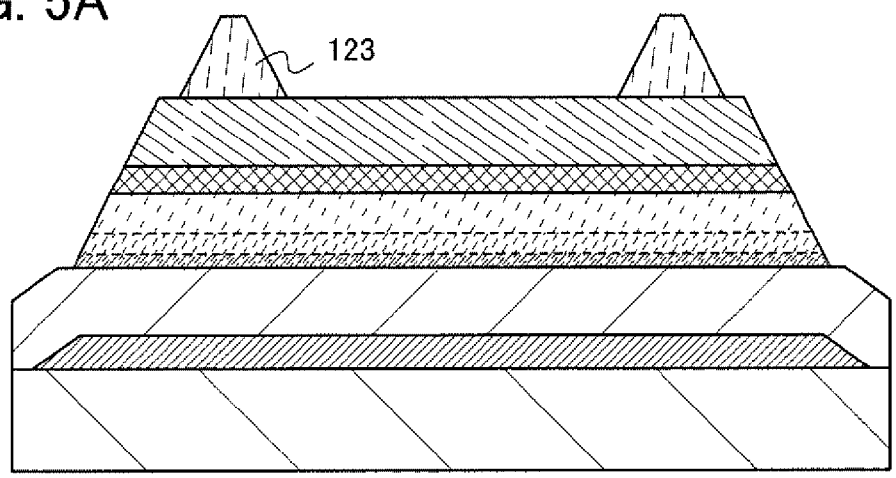
FIGS. 5A to 5C are cross-sectional views explaining a method for manufacturing the thin film transistor.
Figure 5B:
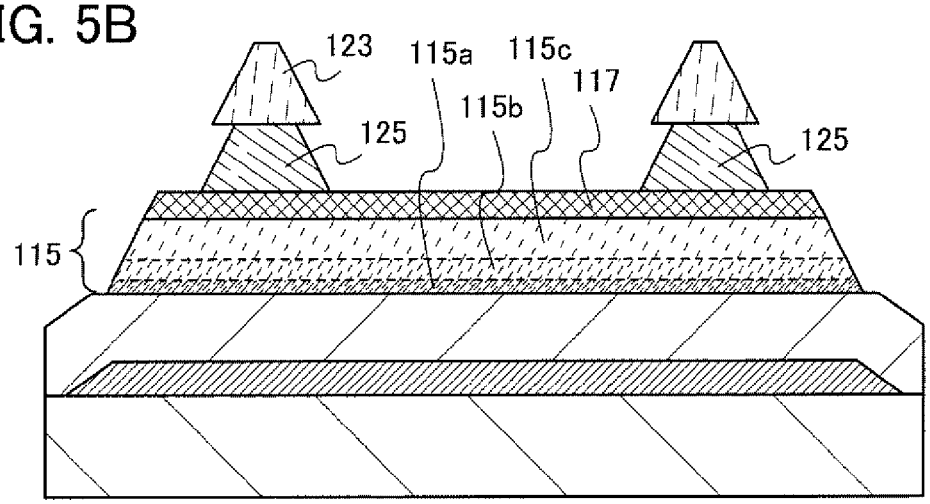
Figure 5C:
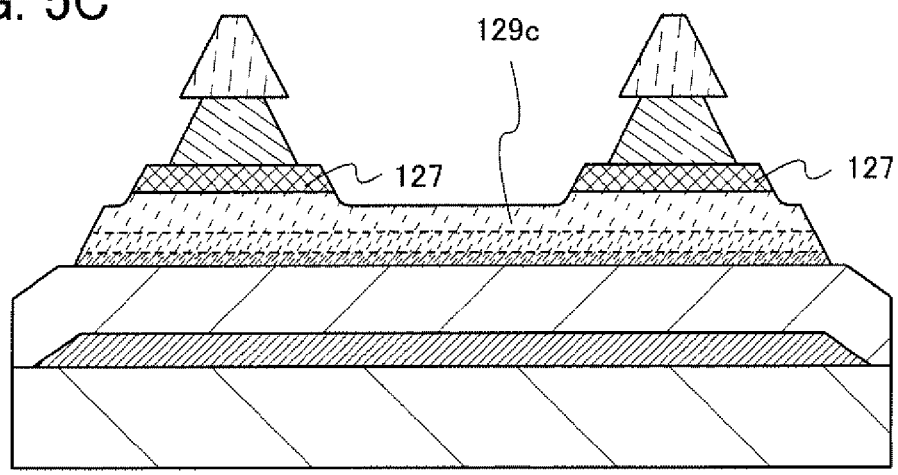

Next, the conductive layer 119 is etched using the third resist masks 123, whereby the source and drain electrodes 125 are formed (see FIG. 5B). The conductive layer 119 is preferably wet-etched. By wet etching, the conductive layer is isotropically etched. As a result, the conductive layer recedes to an inner side than that of the third resist masks 123, and thus the source and drain electrodes 125 are formed. The source and drain electrodes 125 serve not only as source and drain electrodes but also as signal lines. However, without limitation thereto, a signal line may be provided separately from the source and drain electrodes.

Next, with the use of the third resist masks 123, the amorphous semiconductor layer 115c and the impurity semiconductor layer 117 is partly etched. Here, dry etching is employed. Up to this step, an amorphous semiconductor layer 129c having a depression on its surface, and source and drain regions 127 are formed (see FIG. 5C). After that, the third resist masks 123 are removed.

Note that here, the conductive layer 119 is wet-etched and the amorphous semiconductor layer 115c and the impurity semiconductor layer 117 are partly dry-etched. Accordingly, the conductive layer 119 is isotropically etched, and side surfaces of the source and drain electrodes 125 are not aligned with side surfaces of the source and drain regions 127, so that the side surfaces of the source and drain regions 127 are on outer sides than the side surfaces of the source and drain electrodes 125.

Alternatively, the impurity semiconductor layer 117 and the amorphous semiconductor layer 115c may be partly etched after removal of the third resist masks 123. By the etching, the impurity semiconductor layer 117 is etched using the source and drain electrodes 125, so that end portions of the source electrode are approximately aligned with those of the source region. In addition, end portions of the drain electrode are approximately aligned with those of the drain region.

Next, dry etching is preferably performed after removal of the third resist masks 123. A condition of dry etching is set so that the exposed region of the amorphous semiconductor layer 129c is not damaged and the etching rate with respect to the amorphous semiconductor layer 129c is low. In other words, a condition which gives almost no damages to the exposed surface of the amorphous semiconductor layer 129c and hardly reduces the thickness of the exposed region of the amorphous semiconductor layer 129c is applied. As an etching gas, a chlorine-based gas typified by $Cl_2$, $CF_4$, $N_2$, or the like is used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surface of the amorphous semiconductor layer 129c may be irradiated with water plasma, ammonia plasma, nitrogen plasma, or the like.

Water plasma treatment can be performed in such a manner that a gas including water typified by water vapor ($H_2O$ vapor) as its main component is introduced into a reaction space to generate plasma.

As described above, after formation of the source and drain regions 127, dry etching is further performed under such a condition that the amorphous semiconductor layer 129c is not damaged, whereby an impurity such as a residue existing on the exposed surface of the amorphous semiconductor layer 129c can be removed. Further, water plasma treatment is performed successively after dry etching, whereby a residue of the resist masks can be removed. By water plasma treatment, insulation between the source region and the drain region can be secured, and thus, in a thin film transistor to be completed, off-current can be reduced, and variation in electric characteristics can be reduced.

Through the above process, a thin film transistor in which off-current is small, on-current is large, and the threshold voltage is controlled can be manufactured using a small number of masks, with high productivity.

Embodiment 2

In Embodiment 2, one embodiment of a plasma CVD apparatus which can be used for forming the gate insulating layer 105, the first semiconductor layer 106, the second semiconductor layer 107, and the impurity semiconductor layer 109 is described in detail. These layers are formed by a CVD method or the like.

Figure 6:
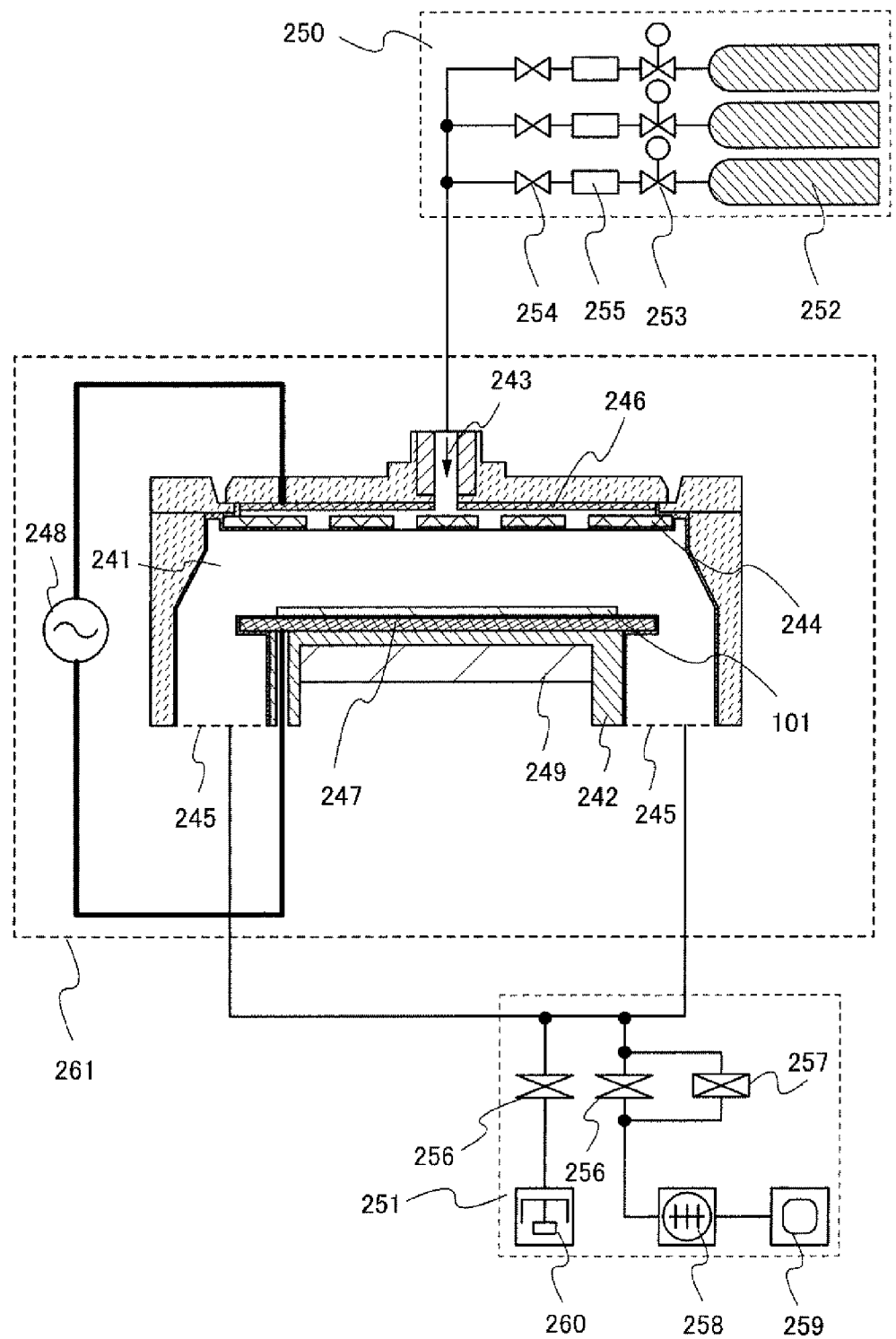
FIG. 6 is one example of a CVD apparatus applicable to a process of manufacturing a thin film transistor.

A plasma CVD apparatus 261 illustrated in FIG. 6 is connected to a gas supply means 250 and an exhaust means 251.

The plasma CVD apparatus 261 illustrated in FIG. 6 includes a treatment chamber 241, a stage 242, a gas supply portion 243, a shower plate 244, an exhaust port 245, an upper electrode 246, a lower electrode 247, an alternate-current power source 248, and a temperature control portion 249.

The treatment chamber 241 is formed using a material having rigidity and the inside thereof can be evacuated to vacuum. The treatment chamber 241 is provided with the upper electrode 246 and the lower electrode 247. Note that in FIG. 6, a structure of a capacitively coupled type (a parallel plate type) is illustrated; however, another structure such as an inductively coupled type can be used, as long as plasma can be generated in the treatment chamber 241 by applying two or more different high frequency powers.

When treatment is performed using the plasma CVD apparatus illustrated in FIG. 6, a given gas is supplied from the gas supply portion 243. The supplied gas is introduced into the treatment chamber 241 through the shower plate 244. High frequency power is applied to excite the gas in the treatment chamber 241 by the alternating-current power source 248 connected to the upper electrode 246 and the lower electrode 247, whereby plasma is generated. Further, the gas in the treatment chamber 241 is exhausted through the exhaust port 245 connected to a vacuum pump. Alternatively, the temperature control portion 249 makes it possible to perform plasma treatment while an object to be processed is being heated.

The gas supply means 250 includes a cylinder 252 which is filled with a reaction gas, a pressure adjusting valve 253, a stop valve 254, a mass flow controller 255, and the like. The treatment chamber 241 includes a shower plate which is processed in a plate-like shape and provided with a plurality of pores, between the upper electrode 246 and the substrate 101. A reaction gas supplied to the upper electrode 246 is supplied to the treatment chamber 241 from the pores in the upper electrode 246 having a hollow structure.

The exhaust means 251 which is connected to the treatment chamber 241 has a function of vacuum evacuation and a function of controlling the pressure inside the treatment chamber 241 to be maintained at a desired level when a reaction gas is supplied. The exhaust means 251 includes in its structure a butterfly valve 256, a conductance valve 257, a turbo molecular pump 258, a dry pump 259, and the like. In the case of arranging the butterfly valve 256 and the conductance valve 257 in parallel, the butterfly valve 256 is closed and the conductance valve 257 is operated, so that the evacuation speed of the reaction gas is controlled and thus the pressure in the treatment chamber 241 can be kept in a desired range. Moreover, the butterfly valve 256 having higher conductance is opened, so that high-vacuum evacuation can be performed.

In the case of performing ultra-high-vacuum evacuation to a pressure lower than $10^{-5}$ Pa on the treatment chamber 241, a cryopump 260 is preferably used together. In addition, when exhaust is performed to ultra-high vacuum as degree of ultimate vacuum, the inner wall of the treatment chamber 241 may be polished into a mirror surface, and the treatment chamber 241 may be provided with a heater for baking in order to reduce a gas discharged from the inner wall.

Note that as illustrated in FIG. 6, precoating treatment is performed so that a film is formed (deposited) so as to cover the entire treatment chamber 241, whereby an impurity attached to the inner wall of the treatment chamber or an impurity included in the inner wall of the treatment chamber can be prevented from being mixed into an element. In Embodiment 2, as the precoating treatment, a film containing silicon as its main component, for example, an amorphous silicon film may be formed. Note that it is preferable that the film do not contain oxygen.

Embodiment 3

In Embodiment 3, a process of forming a second semiconductor layer 107 which can be applied to Embodiment 1 are described.

In Embodiment 3, the inside of a treatment chamber is cleaned before the second semiconductor layer 107 is formed, and after that, the inner wall of the chamber is covered with a silicon nitride layer, whereby nitrogen is included in the second semiconductor layer 107, the oxygen concentration is made low, and the nitrogen concentration is made higher than the oxygen concentration. A series of steps from a step of forming the gate insulating layer 105 to a step of forming the first semiconductor layer 106 is similar to that in Embodiment 1; thus, a series of steps from a step of forming a second semiconductor layer 107 to a step of forming an impurity semiconductor layer 109 is described below with reference to FIG. 7.

The first semiconductor layer 106 is formed over the entire surface of the gate insulating layer 105. First, the source gases used for depositing the first semiconductor layer 106 are introduced into a treatment chamber. Here, as an example, in a manner similar to that of Embodiment 1, a microcrystalline silicon layer with a thickness of approximately 5 nm is formed as the first semiconductor layer 106. After that, the plasma discharge is stopped (formation of first semiconductor layer 211 in FIG. 7). Then, the substrate 101 is carried out of the treatment chamber 241 (unload 225 in FIG. 7).

Figure 7:
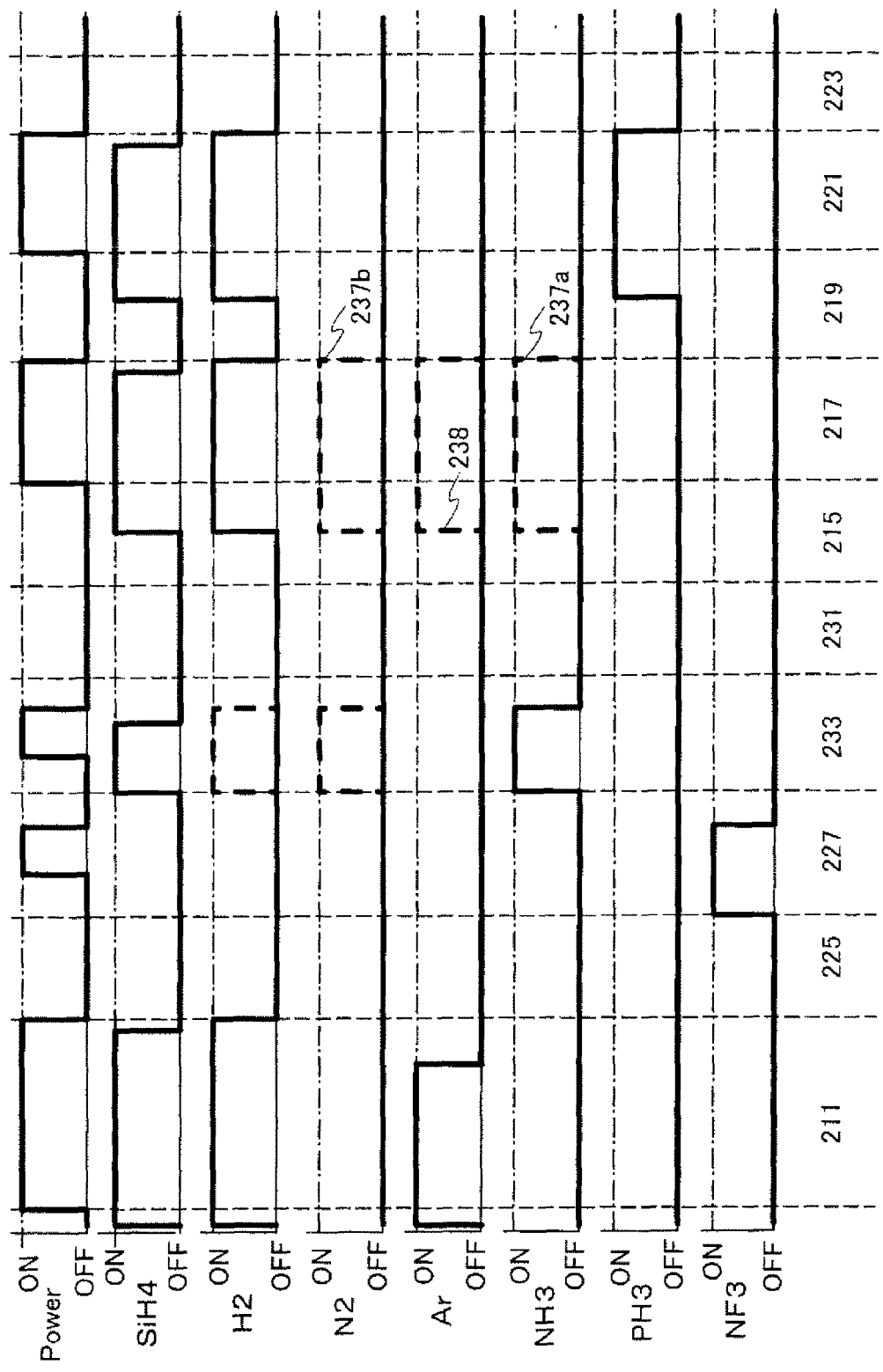
FIG. 7 is one example of a time chart explaining a process of manufacturing a thin film transistor.

The substrate 101 is carried out of the treatment chamber 241, and then for example, an $NF_3$ gas is introduced into the treatment chamber 241 and the inside of the treatment chamber 241 is cleaned (cleaning treatment 227 in FIG. 7). After that, treatment for forming a silicon nitride layer in the treatment chamber 241 is performed (precoating treatment 233 in FIG. 7). The silicon nitride layer is formed under a condition similar to that of the silicon nitride layer formed as the gate insulating layer in Embodiment 1. By this treatment, the silicon nitride layer is formed on the inner wall of the treatment chamber 241. After that, the substrate 101 is carried into the treatment chamber 241 (load 231 in FIG. 7).

Note that the cleaning treatment 227 is not necessarily performed. Accordingly, throughput can be improved.

Next, source gases used for depositing the second semiconductor layer 107 are introduced into the treatment chamber 241 (replacement of gases 215 in FIG. 7). Then, the second semiconductor layer 107 is formed. Here, in a manner similar to Embodiment 1, the second semiconductor layer 107 is formed to a thickness of 150 nm. In particular, a microcrystalline silicon layer can be formed as a microcrystalline semiconductor layer 107a, a layer including microcrystalline silicon and amorphous silicon can be formed as a layer 1071) including a microcrystalline semiconductor and an amorphous semiconductor, and a semiconductor layer including nitrogen and amorphous silicon can be formed as an amorphous silicon layer 107c. After that, the plasma discharge is stopped (formation of second semiconductor layer 217 in FIG. 7).

Note that as indicated by a dashed line 237a in FIG. 7, in formation of the second semiconductor layer 217, ammonia may be supplied to the treatment chamber. Instead of ammonia, as indicated by a dashed line 237b, a nitrogen gas may be supplied. Further alternatively, both ammonia and a nitrogen gas may be supplied. As a result, the nitrogen concentration of the second semiconductor layer 107 is increased, so that dangling bonds included in the second semiconductor layer 107 are cross-linked, leading to reduction in the defect levels.

In the second semiconductor layer 107 formed by such a method, the nitrogen concentration which is measured by secondary ion mass spectrometry has a peak at an upper portion of the microcrystalline semiconductor layer 107a, or at the interface between the microcrystalline semiconductor layer 107a and the layer 107b including a microcrystalline semiconductor and an amorphous semiconductor, and is constant in a direction in which the second semiconductor layer 107 is deposited.

Alternatively, in the formation of second semiconductor layer 217, a rare gas may be used as the source gas as indicated by a dashed line 238. As a result, the growth rate of the second semiconductor layer 107 can be increased.

Then, these gases are exhausted and gases used for depositing the impurity semiconductor layer 109 are introduced (replacement of gases 219 in FIG. 7). In a manner similar to that of Embodiment 1, the impurity semiconductor layer 109 is formed (formation of impurity semiconductor layer 221 in FIG. 7). After that, the source gases of the impurity semiconductor layer 109 are exhausted (exhaust of gas 223 in FIG. 7).

Through this process, ammonia introduced into the treatment chamber in the precoating treatment is dissociated by the plasma discharge, so that an NH group is generated. In addition, by the plasma discharge, the nitrogen gas and a hydrogen gas which is the source gas of the amorphous semiconductor layer are reacted with each other, so that an NH group is generated. Further, the silicon nitride layer formed on the inner wall of the treatment chamber is exposed to plasma, whereby part of silicon nitrogen is dissociated to generate an NH group.

In Embodiment 3, a gas containing nitrogen is supplied to the treatment chamber where the second semiconductor layer 107 is formed, and an NH group is generated in the treatment chamber. As described above, dangling bonds included in the amorphous silicon layer are cross-linked by an NH group. Therefore, by forming the second semiconductor layer 107 in the treatment chamber to which a gas including nitrogen is supplied, an amorphous semiconductor layer including an NH group with which dangling bonds are cross-linked can be formed.

Further, the inner wall of the treatment chamber is covered with a silicon nitride layer just before the second semiconductor layer is formed, whereby the oxygen concentration can be made low and the nitrogen concentration can be made higher than the oxygen concentration, and an amorphous semiconductor layer having an NH group can be formed.

Further, by coating the inner wall of the treatment chamber with the silicon nitride layer, an element or the like included in the inner wall of the treatment chamber is prevented from being mixed into the second semiconductor layer 107.

Note that in the description above, since the second semiconductor layer 107 is formed in the same treatment chamber as that where the first semiconductor layer 106 is formed, cleaning treatment and precoating treatment are performed after formation of the first semiconductor layer 106; however, Embodiment 3 may be carried out in combination with Embodiment 1. That is, after the first semiconductor layer 106 is deposited, silicon nitride layer is formed in the treatment chamber 241 and the flushing treatment 213 may further be performed.

Through the above process, a thin film transistor in which off-current is small, on-current is large, and the threshold voltage is controlled can be manufactured with high productivity.

Embodiment 4

In Embodiment 4, a process of forming a second semiconductor layer 107 which can be applied to Embodiment 1 is described.

In Embodiment 4, nitrogen is mixed into a deposition gas of a second semiconductor layer 107, the oxygen concentration is made low and the nitrogen concentration is made higher than the oxygen concentration. A series of steps from a step of forming the gate insulating layer 105 to a step of forming the first semiconductor layer 106 is similar to that in Embodiment 1; thus, a series of steps from a step of forming the first semiconductor layer 106 to a step of forming an impurity semiconductor layer 109 is described below with reference to FIG. 8.

The first semiconductor layer 106 is formed over the entire surface of the gate insulating layer 105. First, the source gases used for depositing the first semiconductor layer 106 are introduced into the treatment chamber. Here, as an example, in a manner similar to that of Embodiment 1, a microcrystalline silicon layer with a thickness of approximately 5 nm is formed as the first semiconductor layer 106. After that, the plasma discharge is stopped (formation of first semiconductor layer 211 in FIG. 8). Then, these gases are exhausted and gases used for depositing the second semiconductor layer 107 are introduced (replacement of gases 215 in FIG. 8).

Next, the second semiconductor layer 107 is formed. Here, as an example, $SiH_4$, $H_2$, and 1000 ppm of $NH_3$ (diluted with hydrogen) are introduced as source gases at flow rates of 30 sccm, 1425 sccm, and 25 sccm, respectively, and are stabilized; further, the pressure in the treatment chamber is set to 280 Pa, the substrate temperature is set to 280° C., and plasma discharge is performed using an RF power source frequency of 13.56 MHz and power of an RF power source of 50 W, whereby the second semiconductor layer with a thickness of approximately 150 nm is formed. In particular, a microcrystalline semiconductor layer 107a, a layer 107b including a microcrystalline semiconductor and an amorphous semiconductor, and an amorphous semiconductor layer 107c are formed. In the process, ammonia is dissociated by plasma discharge, so that an NH group is generated. Further, when the second semiconductor layer is deposited, dangling bonds can be cross-linked with an NH group (formation of second semiconductor layer 217 in FIG. 8).

Note that as indicated by a dashed line 232, a nitrogen gas may be supplied to the treatment chamber instead of ammonia as a gas containing nitrogen. Alternatively, both ammonia and a nitrogen gas may be supplied. As a result, the nitrogen concentration of the second semiconductor layer 107 is increased, so that dangling bonds included in the second semiconductor layer 107 are cross-linked, leading to reduction in the defect levels.

In the second semiconductor layer 107 formed by such a method, the nitrogen concentration which is measured by secondary ion mass spectrometry is constant in an upper portion of the microcrystalline semiconductor layer 107a or from the interface between the microcrystalline semiconductor layer 107a and the layer 107b including a microcrystalline semiconductor and an amorphous semiconductor to the interface of the impurity semiconductor layer.

Alternatively, in the formation of second semiconductor layer 217, a rare gas may be used as a source gas as indicated by a dashed line 234. As a result, the growth rate of the second semiconductor layer 107 can be increased.

Figure 8:
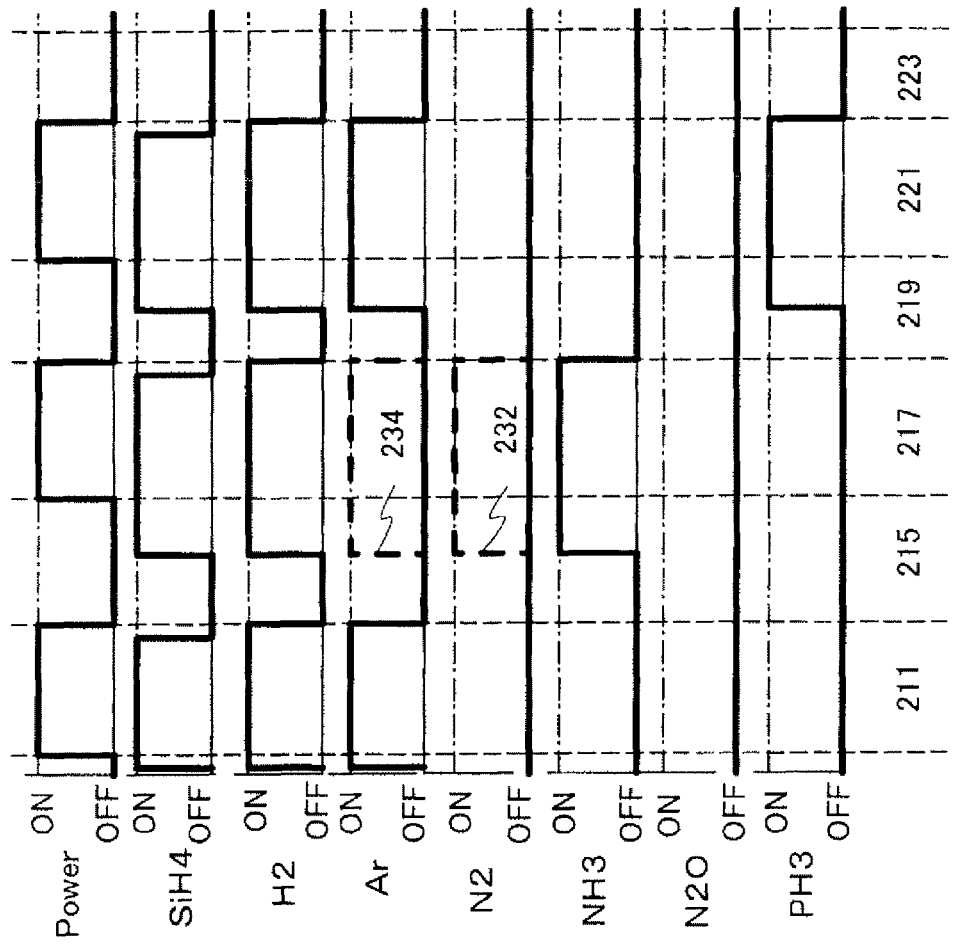
FIG. 8 is one example of a time chart explaining a process of manufacturing a thin film transistor.

Then, these gases are exhausted and gases used for depositing the impurity semiconductor layer 109 are introduced (replacement of gases 219 in FIG. 8). In a manner similar to Embodiment 1, the impurity semiconductor layer 109 is formed (formation of impurity semiconductor layer 221 in FIG. 8). After that, the source gases of the impurity semiconductor layer 109 are exhausted (exhaust of gas 223 in FIG. 8).

In Embodiment 4, the deposition gas of the second semiconductor layer 107 includes a gas containing nitrogen. The gas containing nitrogen is subjected to plasma discharge, so that an NH group is generated. As described above, dangling bonds included in the second semiconductor layer 107 are cross-linked with an NH group. Therefore, an amorphous semiconductor layer having an NH group with which dangling bonds are cross-linked can be formed. After that, the source gases of the impurity semiconductor layer 109 are exhausted (exhaust of gas 223 in FIG. 8).

Through the above process, a thin film transistor in which off-current is small, on-current is large, and the threshold voltage is controlled can be manufactured with high productivity.

Embodiment 5

Figure 9:
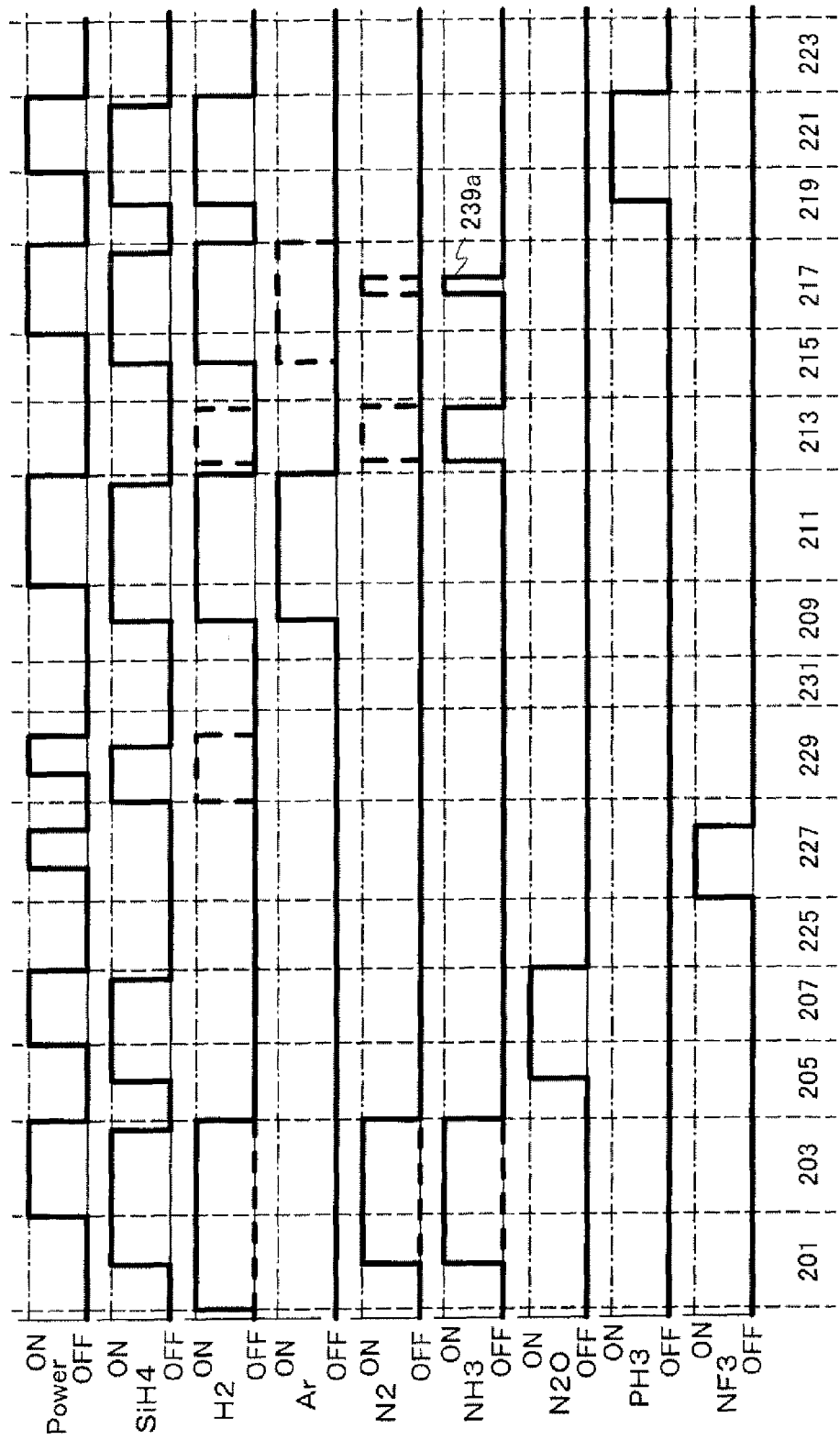
FIG. 9 is one example of a time chart explaining a process of manufacturing a thin film transistor.

A method for manufacturing the second semiconductor layer 107 described in Embodiment 1 is described with reference to FIG. 9.

In Embodiment 1, as a method for forming the second semiconductor layer 107, a gas containing nitrogen is introduced into the treatment chamber by flush treatment 213 after formation of first semiconductor layer 211. However, in addition to the steps in Embodiment 1, in Embodiment 5, a gas containing nitrogen is introduced again into the treatment chamber during formation of the second semiconductor layer 107 (that is, in formation of second semiconductor layer 217), as indicated by a solid line 239a (see FIG. 9). As the gas containing nitrogen, here, ammonia is used. A nitrogen gas may be used instead of ammonia. Alternatively, ammonia and a nitrogen gas may be used. As a result, at the early stage of deposition and during deposition of the second semiconductor layer 107, the nitrogen concentration becomes high, so that the defect levels can be reduced.

In Embodiment 3, as a method for adding nitrogen and also an NH group to the second semiconductor layer 107, a silicon nitride layer is formed in the treatment chamber after the first semiconductor layer 106 is formed. However, in addition to the steps in Embodiment 3, in Embodiment 5, a gas containing nitrogen may be introduced again into the treatment chamber during formation of the second semiconductor layer 107. As the gas containing nitrogen, here, ammonia is used. A nitrogen gas may be used instead of ammonia. Alternatively, ammonia and a nitrogen gas may be used. As a result, at the early stage of deposition of the second semiconductor layer 107 and during deposition of the second semiconductor layer 107, the nitrogen concentration becomes high, so that the defect levels can be reduced. After that, the source gases of the impurity semiconductor layer 109 are exhausted (exhaust of gas 223 in FIG. 9).

Through the above process, a thin film transistor in which off-current is small on-current is large, and the threshold voltage is controlled can be manufactured with high productivity.

Embodiment 6

Another method for manufacturing a thin film transistor, which is different from that in Embodiment 1, is described with reference to FIGS. 10A to 10C and FIGS. 11A and 11B.

In a manner similar to that in Embodiment 1, a gate electrode 103 is formed over a substrate 101. Then, a gate insulating layer 105 and a first semiconductor layer are formed so as to cover the gate electrode 103. Next, in a manner similar to that in Embodiment 1, crystals are grown from the first semiconductor layer, whereby a second semiconductor layer 107 (a microcrystalline semiconductor layer 107a, a layer 107b including a microcrystalline semiconductor and an amorphous semiconductor, and an amorphous semiconductor layer 107c) is formed. Then, an impurity semiconductor layer 109 is formed over the second semiconductor layer 107. After that, a resist mask (not illustrated) is formed over the impurity semiconductor layer 109 (see FIG. 10A).

Next, with the use of the resist mask, the second semiconductor layer 107 and the impurity semiconductor layer 109 are etched. By this step, the second semiconductor layer 107 and the impurity semiconductor layer 109 are divided into elements, so that a second semiconductor layer 115 (a microcrystalline semiconductor layer 115a, a layer 115b including a microcrystalline semiconductor and an amorphous semiconductor, and an amorphous semiconductor layer 115e) and an impurity element layer 117 are formed (see FIG. 10B).

Figure 10A:
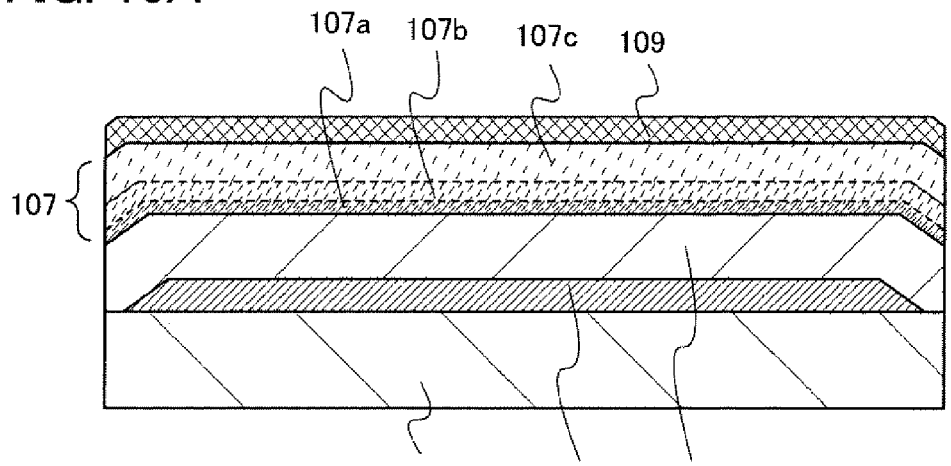
FIGS. 10A to 10C are cross-sectional views explaining a method for manufacturing a thin film transistor.
Figure 10B:
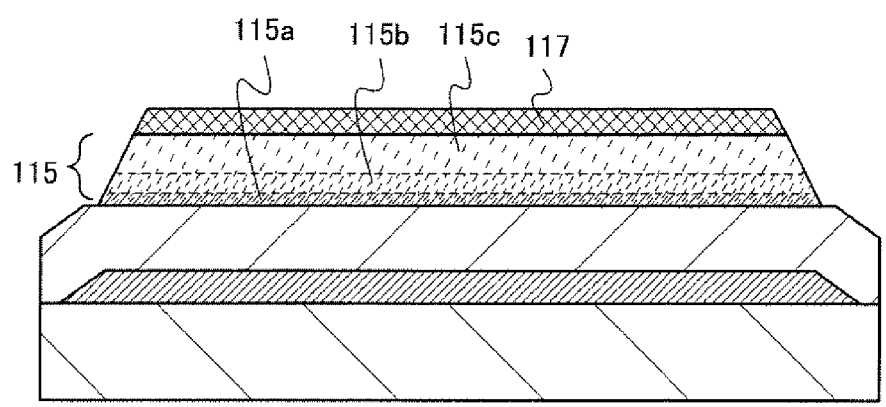
Figure 10C:
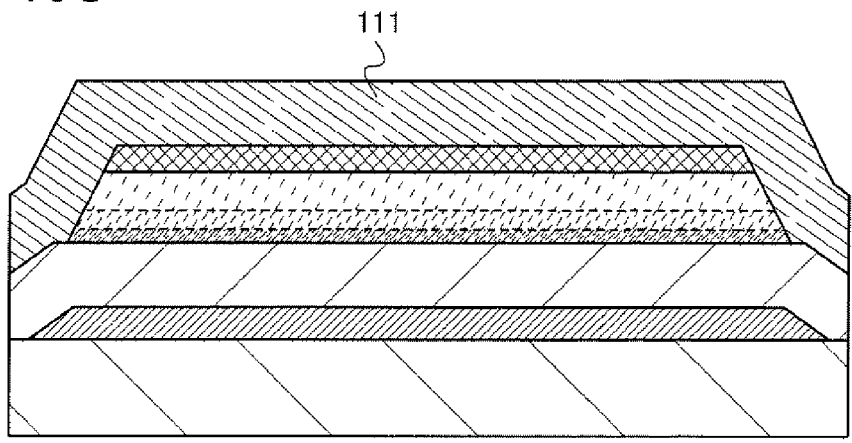

Next, a conductive layer 111 is formed over the gate insulating layer 105, the second semiconductor layer 115, and the impurity semiconductor layer 117 (see FIG. 10C).

Figure 11A:
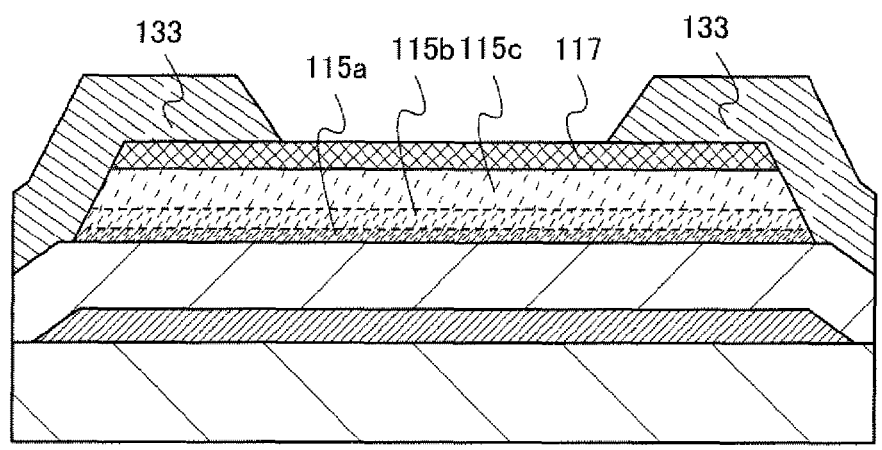
FIGS. 11A and 11B are cross-sectional views explaining a method for manufacturing the thin film transistor.
Figure 11B:
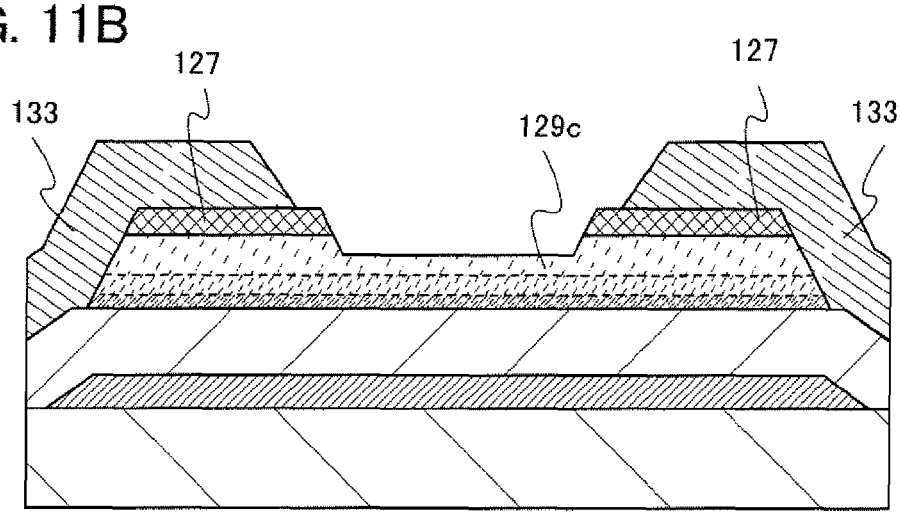

Next, a resist mask (not illustrated) is formed over the conductive layer 111, and the conductive layer 111 is etched with the use of the resist mask, so that source and drain electrodes 133 are formed (see FIG. 11A).

Next, the impurity semiconductor layer 117 is etched using the source and drain electrodes 133 as masks, so that source and drain regions 127 are formed. Further, the amorphous semiconductor layer 115c is etched, so that an amorphous semiconductor layer 129c is formed. After that, the resist mask is removed (see FIG. 11B).

Through the above process, a thin film transistor can be manufactured.

In Embodiment 6, the amorphous semiconductor layer 115c is partly etched without removal of the resist mask after forming the source and drain electrodes 133; however, the impurity semiconductor layer 117 and part of the amorphous semiconductor layer 115c may be etched after removal of the resist mask. In this etching, the impurity semiconductor layer 117 is etched using the source and drain electrodes 133, so that end portions of the source electrode are approximately aligned with those of the source region. In addition, end portions of the drain electrode are approximately aligned with those of the drain region.

Note that instead of the method for forming the second semiconductor layer 107 described in Embodiment 6, a method for forming the second semiconductor layer 107 described in any one of Embodiments 3 to 5 can be applied as appropriate.

Embodiment 7

In Embodiment 7, the channel length of a thin film transistor is shorter than or equal to 10 µm. One mode of the thin film transistor in which resistance of the source and drain regions can be reduced is described below. Here, description is made using Embodiment 1; however, the mode can be applied to any other Embodiments as appropriate.

In the case where the impurity semiconductor layer 109 is formed using a microcrystalline silicon to which phosphorus is added or a microcrystalline silicon to which boron is added, in the second semiconductor layer 107 illustrated in FIG. 1B, a microcrystalline semiconductor layer, typically a microcrystalline silicon layer is formed between the impurity semiconductor layer 109 and the layer 107b including a microcrystalline semiconductor and an amorphous semiconductor or an amorphous semiconductor layer 107c, whereby a layer having low density is not formed at the early stage of deposition of the impurity semiconductor layer 109. Therefore, the impurity semiconductor layer 109 can be grown with the microcrystalline semiconductor layer as a seed crystal, and the interface characteristics can be improved. As a result, resistance generated at the interface between the impurity semiconductor layer 109 and the layer 107b including a microcrystalline semiconductor and an amorphous semiconductor or the amorphous semiconductor layer 107c can be reduced. Accordingly, the amount of current flowing through the source region, the semiconductor layer, and the drain region of the thin film transistor can be increased and on-current and field-effect mobility can be increased.

Embodiment 8

In Embodiment 8, an element substrate to which any of the thin film transistors described in Embodiments 1 to 7 can be applied and a display device including the element substrate are described below. As examples of the display device, a liquid crystal display device, a light-emitting display device, electronic paper, and the like are given. The thin film transistor described in any of Embodiments described above can be used for an element substrate of any other display device. Here, a liquid crystal display device including the thin film transistor described in Embodiment 1, typically, a vertical alignment (VA) mode liquid crystal display device is described with reference to FIG. 12 and FIG. 13.

Figure 12:
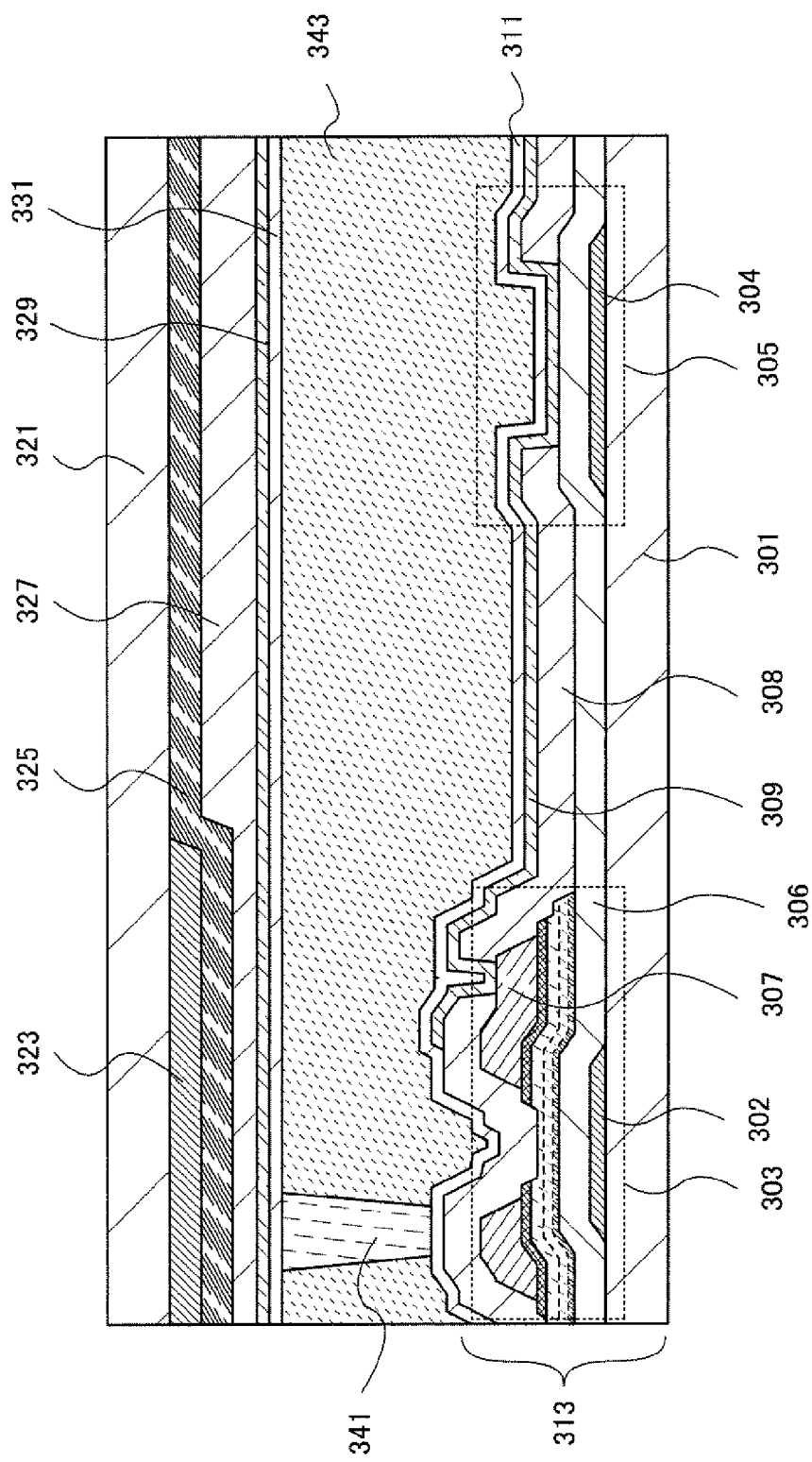
FIG. 12 is a cross-sectional view explaining a display device.

FIG. 12 illustrates a cross-sectional structure of a pixel portion of a liquid crystal display device. A thin film transistor 303 manufactured by above Embodiments and a capacitor 305 are formed over a substrate 301. Further, a pixel electrode 309 is formed over an insulating layer 308 which is formed over the thin film transistor 303. A source or drain electrode 307 of the thin film transistor 303 and the pixel electrode 309 are connected to each other in an opening formed in the insulating layer 308. An alignment film 311 is formed over the pixel electrode 309.

The capacitor 305 includes a capacitor wiring 304 formed at the same time as a gate electrode 302 of the thin film transistor 303, a gate insulating layer 306, and the pixel electrode 309.

A stack body including components from the substrate 301 to the alignment film 311 is referred to as an element substrate 313.

A counter substrate 321 is provided with a light-blocking layer 323 for blocking incidence of light into the thin film transistor 303, and a coloring layer 325. In addition, a planarizing layer 327 is formed on the light-blocking layer 323 and the coloring layer 325. A counter electrode 329 is formed on the planarizing layer 327, and an alignment film 331 is formed on the counter electrode 329.

Note that the light-blocking layer 323, the coloring layer 325, and the planarizing layer 327 on the counter substrate 321 function as color filters. Note that either the light-blocking layer 323 or the planarizing layer 327 or both of them are not necessarily formed on the counter substrate 321.

The coloring layer has a function of preferentially transmitting light in a desired wavelength range, among light of the wavelength range of visible light. In general, a coloring layer which preferentially transmits light in a wavelength range of red light, a coloring layer which preferentially transmits light in a wavelength range of blue light, and a coloring layer which preferentially transmits light in a wavelength range of green light are combined to be used for a color filter. However, combination of the coloring layers is not limited to the above combination.

The substrate 301 and the counter substrate 321 are fixed by a sealant (not illustrated), and an inner side than the substrate 301, the counter substrate 321, and the sealant is filled with a liquid crystal layer 343. Further, a spacer 341 is provided to keep a distance between the substrate 301 and the counter substrate 321.

The pixel electrode 309, the liquid crystal layer 343, and the counter electrode 329 are overlapped with each other, whereby a liquid crystal element is formed.

Figure 13:
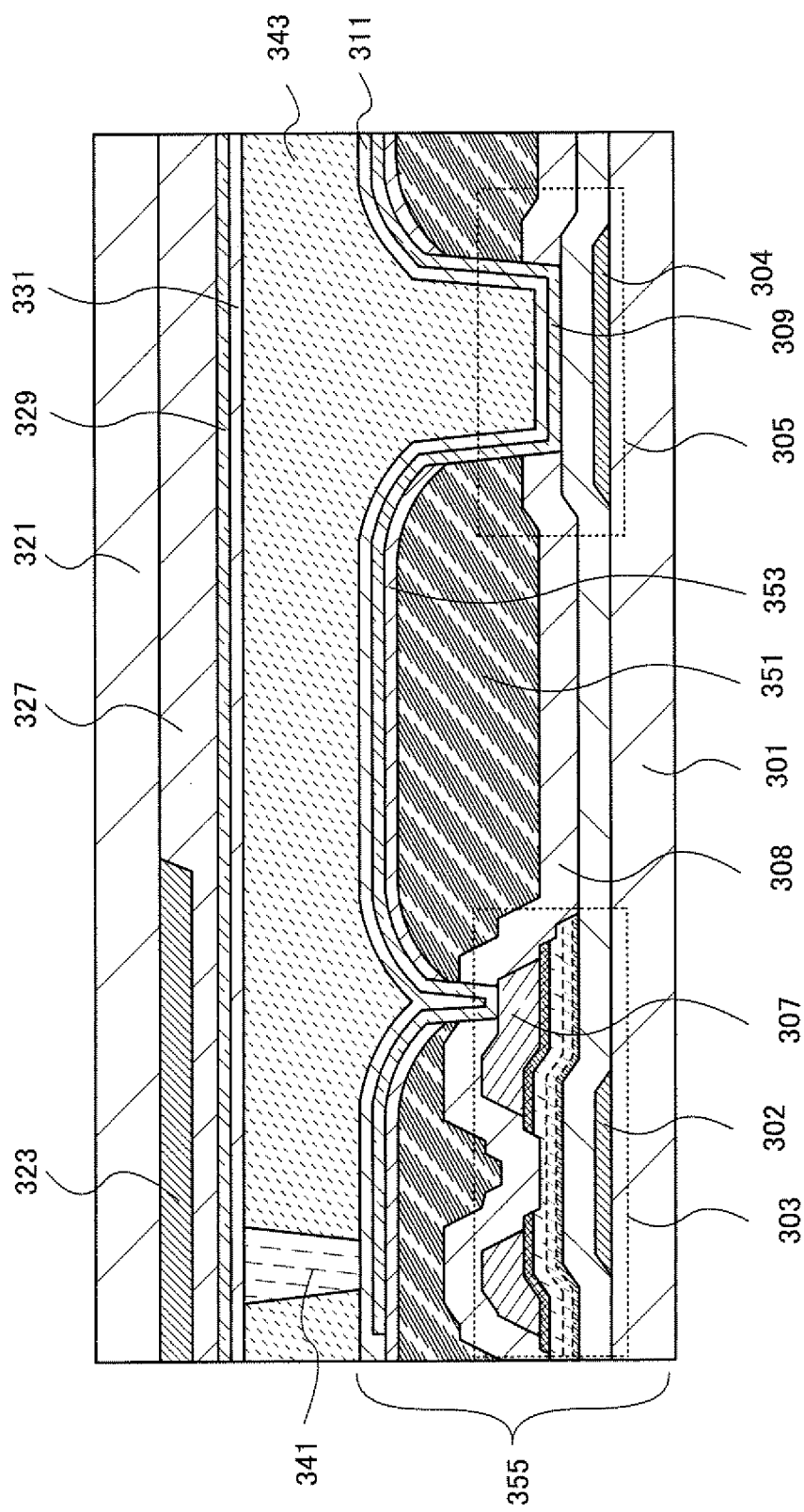
FIG. 13 is a cross-sectional view explaining a display device.

FIG. 13 illustrates a liquid crystal display device different from that in FIG. 12. As one feature of FIG. 13, here, a coloring layer is formed not on the side of a counter substrate 321 but on the side of a substrate 301 provided with a thin film transistor 303.

FIG. 13 illustrates a cross-sectional structure of a pixel portion of a liquid crystal display device. A thin film transistor 303 manufactured in above Embodiments and a capacitor 305 are formed over a substrate 301.

Further, a coloring layer 351 is formed over an insulating layer 308 formed over the thin film transistor 303. Furthermore, a protective layer 353 is formed over the coloring layer 351 in order to prevent an impurity contained in the coloring layer 351 from being mixed into a liquid crystal layer 343. A pixel electrode 309 is formed over the coloring layer 351 and the protective layer 353. As the coloring layer 351, a layer which preferentially transmits light in a desired wavelength range (red light, blue light, or green light) may be formed for each pixel. Further, since the coloring layer 351 also functions as a planarizing layer, uneven alignment of the liquid crystal layer 343 can be suppressed.

A source or drain electrode 307 and the pixel electrode 309 of the thin film transistor 303 are connected to each other in an opening formed in the insulating layer 308, the coloring layer 351, and the protective layer 353. An alignment film 311 is formed over the pixel electrode 309.

The capacitor 305 includes a capacitor wiring 304 formed at the same time as a gate electrode 302 of the thin film transistor 303, a gate insulating layer 306, and the pixel electrode 309.

A stack body including components from the substrate 301 to the alignment film 311 is referred to as an element substrate 355.

The counter substrate 321 is provided with a light-blocking layer 323 for blocking incidence of light into the thin film transistor 303, and a planarizing layer 327 covering the light-blocking layer 323 and the counter substrate 321. A counter electrode 329 is formed on the planarizing layer 327, and an alignment film 331 is formed on the counter electrode 329.

The pixel electrode layer 309, the liquid crystal layer 343, and the counter electrode 329 are overlapped with each other, whereby a liquid crystal element is formed.

Note that the VA mode liquid crystal display device is described here as a liquid crystal display device, but there is no particular limitation. In other words, the element substrate which is formed using the thin film transistor described in Embodiments 1, and 3 to 6 can be used for an FFS mode liquid crystal display device, an IPS mode liquid crystal display device, a TN mode liquid crystal display device, and the like.

Since the thin film transistor with a large on-current, high field-effect mobility, and a small off-current is used as a pixel transistor in the liquid crystal display device of Embodiment 8, image quality of the liquid crystal display device can be improved. Further, electric characteristics of the thin film transistor is not degraded even when the thin film transistor is downsized; therefore, by reducing the area of the thin film transistor, an aperture ratio of the liquid crystal display device can be increased. Alternatively, the area of a pixel can be reduced, so that resolution of the liquid crystal display device can be improved.

Further, in the liquid crystal display device illustrated in FIG. 13, the light-blocking layer 323 and the coloring layer 351 are not formed over the same substrate. Therefore, misalignment of a mask in formation of the coloring layer 351 can be prevented. The area of the light-blocking layer 323 is not necessarily increased, which can increase an aperture ratio of a pixel.

Embodiment 9

By being provided with a light-emitting element instead of the alignment film 311, the element substrate 313 described in Embodiment 8 can be used for a light-emitting display device or a light-emitting device. As for a light-emitting display device or a light-emitting device, a light-emitting element utilizing electroluminescence is typically given as a light-emitting element. Light-emitting elements utilizing electroluminescence are roughly classified according to whether a light-emitting material is an organic compound or an inorganic compound. In general, the former is referred to as organic EL elements and the latter as inorganic EL elements.

In the light-emitting display device or the light-emitting device of Embodiment 9, a thin film transistor with large on-current, high field-effect mobility, and small off-current is used as a pixel transistor; therefore, the light-emitting display device or the light-emitting device can have favorable image quality (for example, high contrast) and low power consumption.

Embodiment 10

A display device including the thin film transistor according to any of Embodiments described above can be applied to a variety of electronic appliances (including an amusement machine). Examples of electronic appliances are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 8 and 9, the thin film transistor according to any of Embodiments can be applied for a display portion of an electronic appliance such as a liquid crystal display device, a light-emitting device, an electrophoretic display device, or the like. Specific examples are described below.

A semiconductor device including the thin film transistor according to any of the above Embodiments can be applied to electronic paper. Electronic paper can be used for electronic appliances of a variety of fields as long as they can display data. For example, electronic paper can be applied to an electronic book (e-book reader), a poster, an advertisement in a vehicle such as a train, or displays of various cards such as a credit card. One example of the electronic appliances is illustrated in FIG. 14A.

Figure 14A:
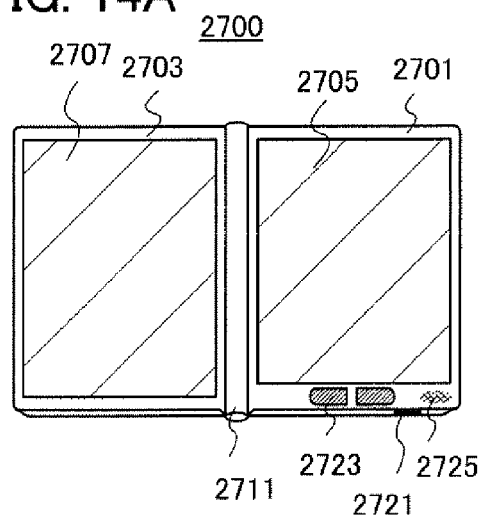
FIGS. 14A to 14D are drawings each illustrating electronic apparatus to which the thin film transistor is applied.

FIG. 14A illustrates an example of an electronic book 2700. For example, the electronic book 2700 includes two chassis, a chassis 2701 and a chassis 2703. The chassis 2701 and the chassis 2703 are combined with a hinge 2711 so that the electronic book 2700 can be opened and closed. With such a structure, the electronic book 2700 can operate like a paper book.

A display portion 2705 and a display portion 2707 are incorporated in the chassis 2701 and the chassis 2703, respectively. The display portion 2705 and the display portion 2707 may display one image or different images. In the structure where different images are displayed on different display portions, for example, the right display portion (the display portion 2705 in FIG. 14A) displays text and the left display portion (the display portion 2707 in FIG. 14A) displays images.

FIG. 14A illustrates an example in which the chassis 2701 is provided with an operation portion and the like. For example, the chassis 2701 is provided with a power switch 2721, an operation key 2723, a speaker 2725, and the like. With the operation key 2723, pages can be turned. Note that a keyboard, a pointing device, and the like may be provided on the same surface as the display portion of the chassis. Furthermore, an external connection terminal (an earphone terminal, a USB terminal, a terminal that can be connected to various cables such as an AC adapter or a USB cable, or the like), a recording medium insert portion, and the like may be provided on the back surface or the side surface of the chassis. Moreover, the electronic book 2700 may have a function of an electronic dictionary.

The electronic book 2700 may transmit and receive information wirelessly. Through wireless communication, desired book data or the like can be purchased and downloaded from an electronic book server.

Figure 14B:
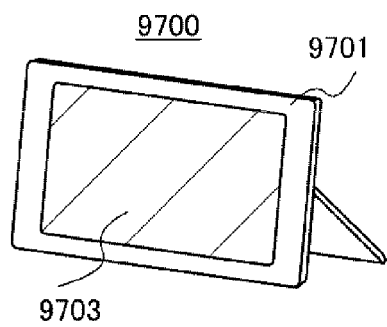

FIG. 14B illustrates an example of a digital photo frame 9700. For example, in the digital photo frame 9700, a display portion 9703 is incorporated in a chassis 9701. Various images can be displayed on the display portion 9703. For example, the display portion 9703 can display data of an image taken by a digital camera or the like to function as a general photo frame.

Note that the digital photo frame 9700 is provided with an operation portion, an external connection terminal (a USB terminal, a terminal that can be connected to various cables such as a USB cable, or the like), a recording medium insert portion, and the like. Although these functions may be provided on the same surface as the display portion, it is preferable to provide such functions on the side surface or the back surface for good design. For example, a memory storing data of an image taken by a digital camera is inserted in the recording medium insert portion of the digital photo frame, and the image data can be imported and displayed on the display portion 9703.

The digital photo frame 9700 may transmit and receive information wirelessly. Through wireless communication, desired image data can be imported and displayed.

Figure 14C:
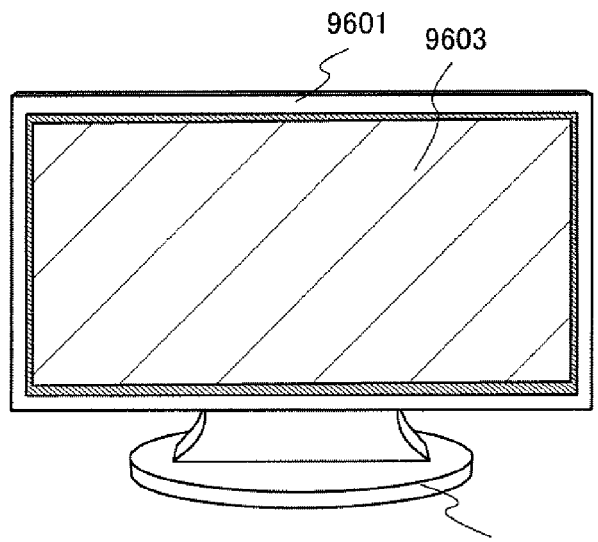

FIG. 14C illustrates an example of a television device 9600. In the television device 9600, a display portion 9603 is incorporated in a chassis 9601. Images can be displayed on the display portion 9603. Here, the chassis 9601 is supported by a stand 9605. Any of the display devices described in Embodiments 8 and 9 can be applied to the display portion 9603.

The television device 9600 can be operated by an operation switch provided for the chassis 9601 or a separate remote controller. Channels and volume can be controlled by an operation key of the remote controller, so that an image displayed on the display portion 9603 can be controlled. Further, the remote controller may be provided with a display portion for displaying data output from the remote controller.

Note that the television device 9600 is provided with a receiver, a modem, and the like. With the receiver, a general television broadcast can be received. Furthermore, when the television device 9600 is connected to a communication network by wired or wireless connection via the modem, one-way (from a transmitter to a receiver) or two-way (between a transmitter and a receiver, between receivers, or the like) information communication can be performed.

Figure 14D:
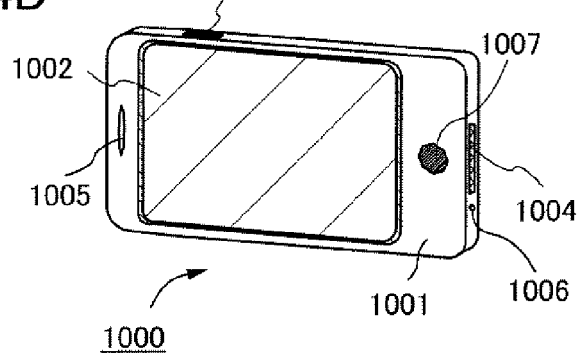

FIG. 14D illustrates an example of a mobile phone 1000. The mobile phone 1000 is provided with a display portion 1002 incorporated in a chassis 1001, operation buttons 1003 and 1007, an external connection port 1004, a speaker 1005, a microphone 1006, and the like. Any of the display devices described in Embodiments 8 and 9 can be applied to the display portion 1002.

The display portion 1002 of the mobile phone 1000 illustrated in FIG. 14D is a touch screen. When the display portion 1002 is touched with a finger or the like, contents displayed on the display portion 1002 can be controlled. Further, operations such as making a phone call or texting a message can be performed by touching the display portion 1002 with a finger or the like.

There are mainly three screen modes of the display portion 1002. The first mode is a display mode mainly for displaying an image. The second mode is an input mode mainly for inputting information such as text. The third mode is a display-and-input mode in which two modes of the display mode and the input mode are mixed.

For example, in making a phone call or texting a message, a text input mode mainly for inputting text is selected for the display portion 1002, and input operation is conducted by touching characters displayed on a screen. In that case, it is preferable to display a keyboard or number buttons on almost the entire area of the screen of the display portion 1002.

When a detection device including a sensor for detecting inclination, such as a gyroscope or an acceleration sensor, is provided inside the mobile phone 1000, display of the display portion 1002 can be automatically switched by determining the direction of the mobile phone 1000 (whether the mobile phone 1000 is placed horizontally or vertically for a landscape mode or a portrait mode).

The screen modes are switched by touch on the display portion 1002 or operation of the operation button 1007 of the chassis 1001. Alternatively, the screen modes can be switched depending on kinds of images displayed on the display portion 1002. For example, when a signal of an image displayed on the display portion is of moving image data, the screen mode can be switched to the display mode. When the signal is of text data, the screen mode can be switched to the input mode.

Moreover, in the input mode, when input by touching the display portion 1002 is not performed within a specified period while a signal detected by the optical sensor in the display portion 1002 is detected, the screen mode may be controlled so as to be switched from the input mode to the display mode.

The display portion 1002 can also function as an image sensor. For example, an image of a palm print, a fingerprint, or the like is taken by an image sensor when the display portion 1002 is touched with a palm or a finger, whereby personal authentication can be performed. Furthermore, when a backlight or a sensing light source, which emits a near-infrared light, is provided for the display portion, an image of a finger vein, a palm vein, or the like can also be taken.

Embodiment 10 can be combined with any structures disclosed in other Embodiments, as appropriate.

Example 1

In Example 1, presence of argon in source gases of a microcrystalline silicon layer and deposition rates are described with reference to FIG. 15A.

A method for forming samples is described below.

A microcrystalline silicon layer was formed to a thickness of 50 nm over a glass substrate (AN100 manufactured by Asahi Glass Co., Ltd.). The deposition conditions at this time were as follows: as source gases, hydrogen at flow rate of 1250 sccm, silane, and argon were introduced into a treatment chamber of a plasma CVD apparatus and were stabilized; further, the pressure in the treatment chamber was 280 Pa, the substrate temperature was 280° C., and plasma discharge was performed using an RF source power frequency of 13.56 MHz and power of an RF power source of 50 W.

In formation of the microcrystalline silicon layer, the flow rate of silane was set to 10 sccm, 20 sccm, or 30 sccm. Further, the flow rate of argon was set to 0 sccm, 1000 sccm, 1500 sccm, or 2000 sccm.

Figure 15A:
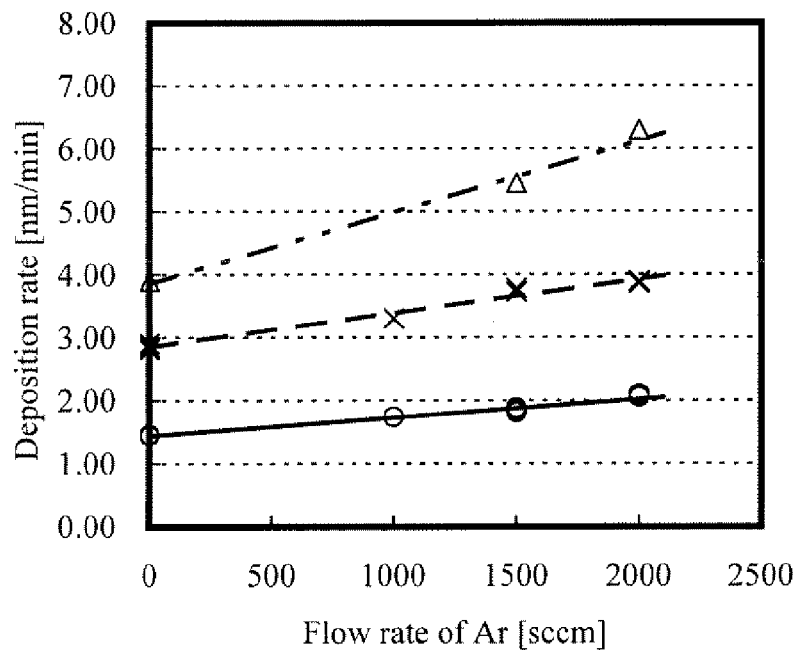
FIGS. 15A and 15B are graphs showing deposition rates of a microcrystalline silicon layer.

FIG. 15A shows relation between the flow rates of argon and the deposition rates. Note that circles indicate the relation between the flow rate of argon and the deposition rate when the flow rate of silane is 10 sccm. Cross marks indicate the relation between the flow rate of argon and the deposition rate when the flow rate of silane is 20 sccm. Triangles indicate the relation between the flow rate of argon and the deposition rate when the flow rate of silane is 30 sccm. Further, thicknesses of the microcrystalline silicon layers were measured using an optical thin film analysis system FilmTek 1000 (reflection type) manufactured by SCI (Scientific Computing International).

When the flow rate of argon is set to 2000 sccm, deposition rates at the flow rate of silane of 10 sccm, 20 sccm, and 30 sccm are approximately 1.3 to 1.6 times as compared to those when the flow rate of argon is set to 0 sccm. FIG. 15A shows that as the flow rate of argon is increased, the deposition rate of the microcrystalline silicon layer is increased.

Figure 15B:
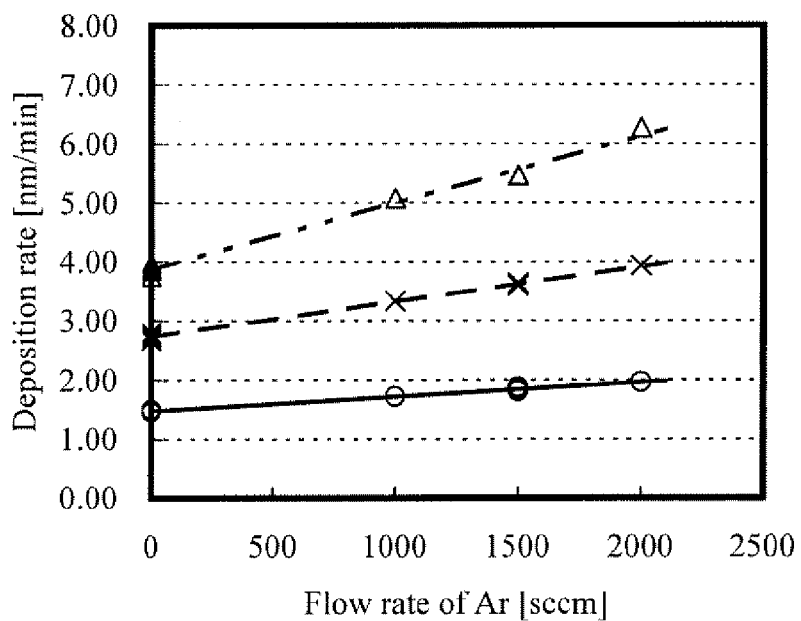

Next, in formation of a microcrystalline silicon layer containing nitrogen, the deposition rate when the argon as a rare gas exists or does not exist is shown in FIG. 15B.

A method for forming samples is described below.

A microcrystalline silicon layer containing nitrogen was formed to a thickness of 50 nm over a glass substrate (AN100 manufactured by Asahi Glass Co., Ltd.). The deposition conditions at this time were as follows: as source gases, hydrogen at a flow rate of 1250 sccm, 100 ppm ammonia (diluted with hydrogen) at a flow rate of 250 sccm, silane, and argon were introduced into a treatment chamber and were stabilized; further, the pressure in the treatment chamber was set to 280 Pa, the substrate temperature was set to 280° C., and plasma discharge was performed using an RF power source frequency of 13.56 MHz and power of an RF power source of 50 W so as to form a microcrystalline silicon layer containing nitrogen.

At this time, the flow rate of silane was set to 10 sccm, 20 sccm, or 30 sccm. Further, the flow rate of argon was set to 0 sccm, 1000 sccm, 1500 sccm, or 2000 sccm.

FIG. 15B shows relation between the flow rates of argon and the deposition rates. Note that circles indicate the relation between the flow rate of argon and the deposition rate when the flow rate of silane is 10 sccm. Cross marks indicate the relation between the flow rate of argon and the deposition rate when the flow rate of silane is 20 sccm. Triangles indicate the relation between the flow rate of argon and the deposition rate when the flow rate of silane is 30 sccm.

When the flow rate of argon is set to 2000 sccm, deposition rates at the flow rate of silane of 10 sccm, 20 sccm, and 30 sccm, are approximately 1.3 to 1.6 times as compared to those when the flow rate of argon is set to 0 sccm. FIG. 15B shows that as the flow rate of argon is increased, the deposition rate of the microcrystalline silicon layer containing nitrogen is increased.

Example 2

In Example 2, presence of argon in source gases of a microcrystalline silicon layer and crystallinity of the microcrystalline silicon layer are described with reference to FIG. 16 and FIGS. 17A and 17B.

As a base layer, a silicon oxynitride layer was formed over a substrate, and then a microcrystalline silicon layer was formed over the silicon oxynitride layer.

Here, as the substrate, a glass substrate (AN100 manufactured by Asahi Glass Co., Ltd.) was used.

As source gases, $SiH_4$ and $N_2O$ were introduced at flow rates of 30 sccm and 1200 sccm, respectively, and were stabilized; further, the pressure in a treatment chamber was set to 40 Pa, the substrate temperature was set to 280° C., and plasma discharge was performed at output of 50 W, whereby the silicon oxynitride layer with a thickness of approximately 100 nm was formed.

Next, as source gases, $SiH_4$, and $H_2$ were introduced at flow rates of 10 sccm and 1500 sccm, respectively, and stabilized, while the flow rate of argon was set to one of 0 scorn, 500 sccm, 1000 sccm, 1500 scorn, or 2000 sccm; further, the pressure in the treatment chamber was set to 280 Pa, the substrate temperature was set to 280° C., and plasma discharge was performed using an RF power source frequency of 13.56 MHz and power of an RF power source of 50 W, whereby the microcrystalline silicon layer with a thickness of 50 nm was formed by a plasma CVD method.

Next, crystallinity of the microcrystalline silicon layer was analyzed by Raman spectroscopy. Here, High Resolution Double Grating Research Raman Spectrometer U1000 manufactured by Horiba Jobin Yvon was employed.

Figure 16:
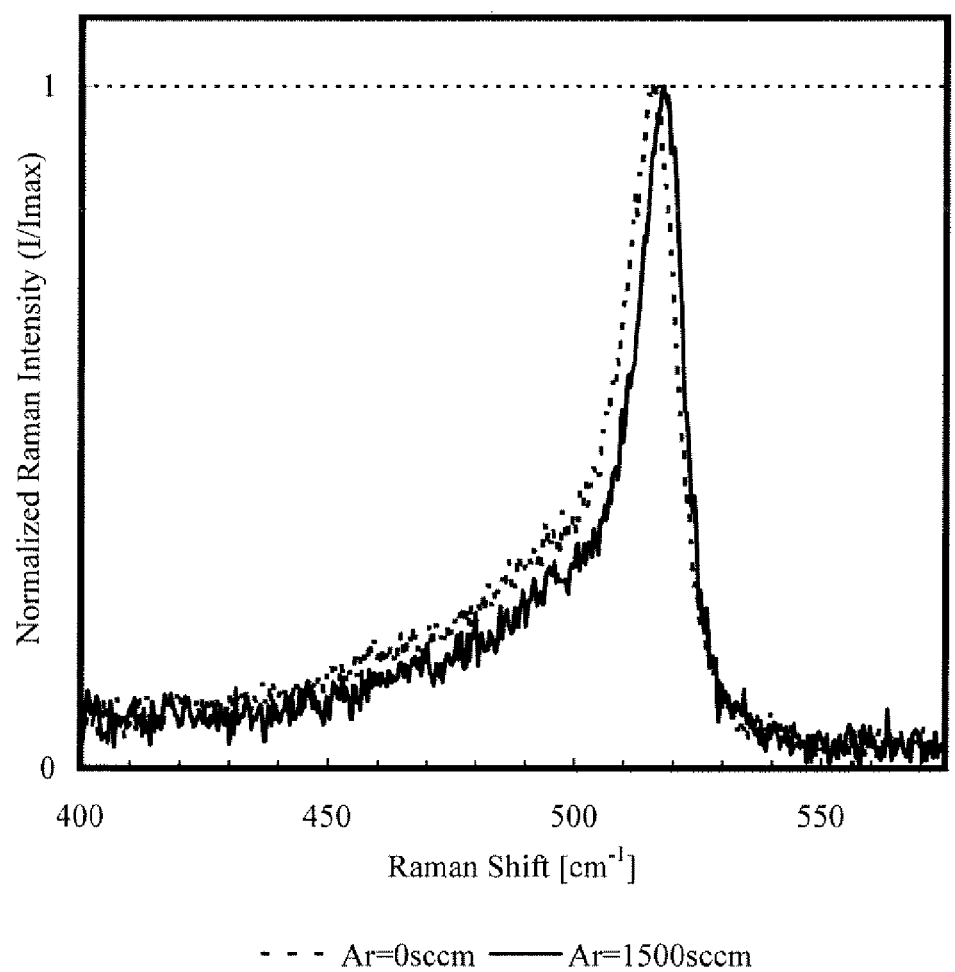
FIG. 16 is a graph showing a measurement result of a Raman spectroscopic analysis.

Here, as a typical example, FIG. 16 shows Raman spectra of the sample formed at the flow rate of argon of 0 sccm and the sample formed at the flow rate of argon of 1500 scorn, which were obtained by standardizing results of Raman spectroscopic analysis. A solid line shows a Raman spectrum of the latter sample and a dashed line shows a Raman spectrum of the former sample. The solid line shows that a peak of the Raman spectrum is shifted to a higher wave number side of $520$ $cm^{-1}$ which represents a Raman spectrum of single crystal silicon.

Figure 17A:
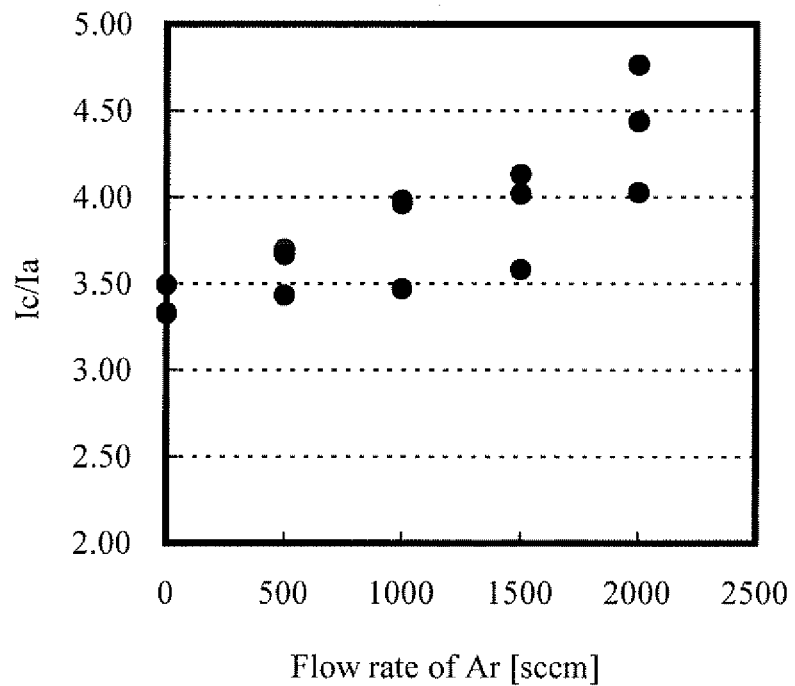
FIGS. 17A and 17B are graphs showing measurement results of a Raman spectroscopic analysis.

Next, a Raman spectroscopic analysis was performed on microcrystalline silicon layers which were formed at different flow rates of argon as the source gas, and crystalline/amorphous peak intensity ratio (Ic/Ia) is shown in FIG. 17A.

It is found that the crystalline/amorphous peak intensity ratio (Ic/Ia) becomes larger as the flow rate of argon is increased.

Figure 17B:
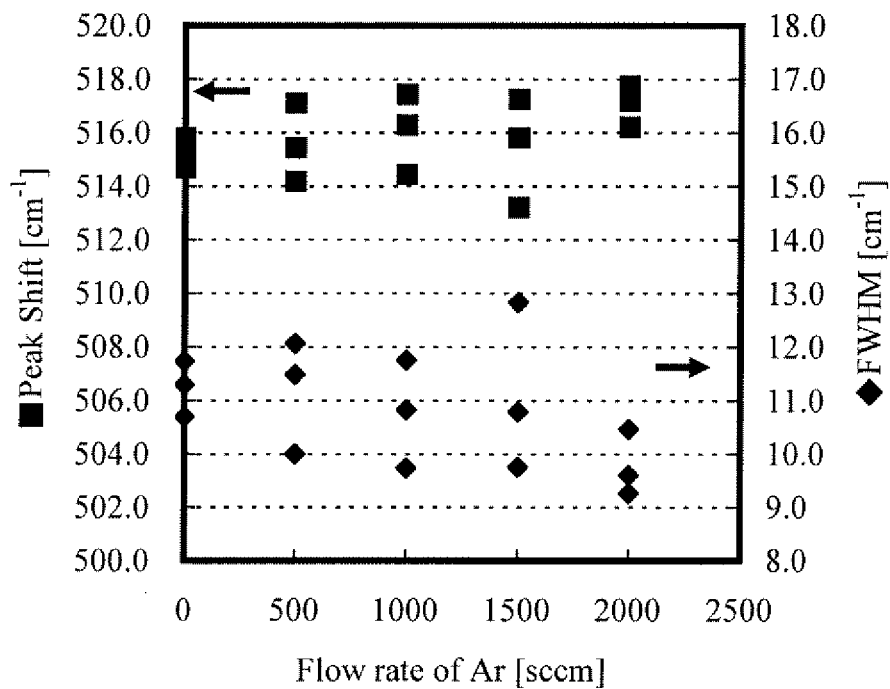

Next, a Raman spectroscopic analysis was performed on the microcrystalline silicon layers which were formed at different flow rates of argon as the source gas, and peak shift values and full widths at half maximum (FWHM) are shown in FIG. 17B. Note that in FIG. 17B, the peak shift value is represented by the left vertical axis and squares, and the FWHM is represented by the right vertical axis and diamonds.

As the flow rate of argon is increased, the peak shift value is slightly increased, getting closer to $520$ $cm^{-1}$, which is the peak of single crystal silicon.

Further, as the flow rate of argon is increased, the full width at half maximum (FWHM) is decreased.

Accordingly, as shown in FIG. 16 and FIGS. 17A and 17B, it is found that crystallinity of the microcrystalline silicon layer is increased by adding argon to the source gases of the microcrystalline silicon layer.

Example 3

First, a process of manufacturing a thin film transistor is described with reference to FIGS. 1A to 1C, FIGS. 10A to 10C, and FIGS. 11A and 11B.

A gate electrode 103 was formed over a substrate 101.

Here, a glass substrate (EAGLE2000 manufactured by Corning Incorporated) was used as the substrate 101.

A molybdenum target was sputtered onto the substrate with argon ions at a flow rate of 50 sccm, so that a molybdenum layer with a thickness of 150 nm was formed over the substrate 101. Next, after the molybdenum layer was coated with a resist, light exposure was performed using a first photomask. After that, development was performed, so that a resist mask was formed.

Next, the molybdenum layer was etched with the use of the resist mask, so that the gate electrode 103 was formed. Here, an ICP (inductively coupled plasma) etching apparatus was used. The etching conditions were as follows: the ICP power was 800 W, the bias power was 100 W, the pressure was 1.5 Pa, and as the etching gases, carbon fluoride, chlorine, and oxygen were used at the flow rates of 25 sccm, 25 sccm, and 10 sccm, respectively.

After that, the resist mask was removed.

Next, a gate insulating layer 105 and a first semiconductor layer 106 were formed over the gate electrode 103 and the substrate 101. The steps up to this point are illustrated in FIG. 1A.

Here, as the gate insulating layer 105, a silicon nitride layer with a thickness of 110 nm and a silicon oxide layer with a thickness of 110 nm were formed.

The deposition conditions of the silicon nitride layer were as follows: $SiH_4$, $H_2$, $N_2$, and $NH_3$ were introduced as source gases at the flow rates of 40 sccm, 500 sccm, 550 sccm, and 140 sccm, respectively, and were stabilized; further, the pressure of a treatment chamber was set to 100 Pa, the substrate temperature was set to 280° C., and a plasma CVD method is conducted in which plasma discharge was performed using an RF power source frequency of 13.56 MHz and power of an RF power source of 370 W.

The deposition conditions of the silicon oxide layer were as follows: tetraethyl orthosilicate (TEOS) and $O_2$ were introduced as source gases at the flow rates of 15 sccm and 750 sccm, respectively, and were stabilized; further, the pressure of the treatment chamber was set to 100 Pa, the temperature of an upper electrode was set to 300° C., the temperature of a lower electrode was set to 297° C., and a plasma CVD method is conducted in which plasma discharge was performed using an RF power source frequency of 27 MHz and power of an RF power source of 300 W.

Here, as the first semiconductor layer 106, a microcrystalline silicon layer with a thickness of 5 nm was formed.

The deposition conditions of the first semiconductor layer 106 are described below. First, the pressure in the treatment chamber was set to 100 Pa and silane at a flow rate of 300 sccm was introduced into the treatment chamber, whereby an impurity in the treatment chamber was removed. Then, $SiH_4$, H₂, and argon were introduced as source gases at flow rates of 10 sccm, 1500 sccm, and 1500 sccm, respectively, and were stabilized; further, the pressure in the treatment chamber was set to 280 Pa, the substrate temperature was set to 280° C., and a plasma CVD method was conducted in which plasma discharge was performed using an RF power source frequency of 13.56 MHz and power of an RF power source of 50 W.

Next, as illustrated in FIG. 10A, a second semiconductor layer 107 was formed and an impurity semiconductor layer 109 was formed over the second semiconductor layer 107.

Here, the second semiconductor layer 107 was formed to a thickness of 150 nm. Further, as the second semiconductor layer 107, a microcrystalline silicon layer was formed as a microcrystalline semiconductor layer 107a, a semiconductor layer including microcrystalline silicon, amorphous silicon, and nitrogen was formed as a layer 107b including a microcrystalline semiconductor and an amorphous semiconductor, and a semiconductor layer including nitrogen and amorphous silicon was formed as an amorphous semiconductor layer 107c.

As the deposition conditions of the second semiconductor layer 107, SiH₄, 1000 ppm NH₃ (diluted with hydrogen), and H₂ were introduced as source gases at flow rates of 30 sccm, 25 sccm, and 1475 sccm, respectively, and were stabilized; further, the pressure in the treatment chamber was set to 280 Pa, the substrate temperature was set to 280° C., and plasma discharge was performed using power of an RF power source of 50 W.

As the impurity semiconductor layer 109, an amorphous silicon layer to which phosphorus was added was formed to a thickness of 50 nm. As the deposition conditions at this time, flow rates of silane and 0.5% phosphine (diluted with hydrogen) were set to 100 sccm and 170 sccm, respectively, the deposition temperature was set to 280° C., the pressure was set to 170 Pa, and a plasma CVD method was conducted in which plasma discharge was performed using an RF power source frequency of 13.56 MHz and power of an RF power source of 60 W.

Next, a resist was applied to the impurity semiconductor layer 109 and light exposure was performed using a second photomask. After that, development was performed, so that a resist mask was formed. Then, with the use of the resist mask, the second semiconductor layer 107 and the impurity semiconductor layer 109 were etched so as to form a second semiconductor layer 115 and an impurity semiconductor layer 117 (see FIG. 10B). Here, an ICP etching apparatus was used, and the etching conditions were as follows: the source power was set to 1000 W, the bias power was set to 80 W, the pressure was set to 1.51 Pa, and chlorine was used as an etching gas at a flow rate of 100 sccm. After that, the resist mask was removed.

Next, as illustrated in FIG. 10C, a conductive layer 119 was formed so as to cover the gate insulating layer 105, the second semiconductor layer 115, and the impurity semiconductor layer 117. Here, a molybdenum layer with a thickness of 300 nm was formed by sputtering a molybdenum target with argon ions at a flow rate of 50 sccm.

Next, a resist was applied to the conductive layer 119 and light exposure was performed using a third photomask. After that, development was performed, so that a resist mask was formed. The conductive layer 111 was wet-etched using the resist mask, whereby source and drain electrodes 133 were formed as illustrated in FIG. 11A. Here, the conductive layer 111 was wet-etched. Note that in Example 3, the source electrode 133 and the drain electrode 133 are parallel in a plan view.

Next, with the use of the resist mask, the impurity semiconductor layer 117 was etched so as to form source and drain regions 127. Note that in this step, the second semiconductor layer 115 was also partly etched, whereby an amorphous semiconductor layer 129c having a depression was formed (see FIG. 11B). Here, the etching conditions were as follows: the ICP power was set to 150 W, the bias power was set to 40 W, the pressure was set to 1.2 Pa, and chlorine was used as an etching gas at a flow rate of 100 sccm. The etching depth was 90 nm deep. At this time, the total thickness of the microcrystalline semiconductor layer 115a, the layer 115b including a microcrystalline semiconductor and an amorphous semiconductor, and the left region of amorphous semiconductor layer 129c which was partly etched was 110 nm.

Next, after removal of the resist mask, surfaces of the amorphous semiconductor layer 129c and the source and drain regions 127 were irradiated with carbon fluoride plasma so that impurity remaining on the surface of the amorphous semiconductor layer 129e was removed. Here, the etching conditions were as follows: source power was set to 1000 W, the bias power was set to 0 W, the pressure was set to 0.67 Pa, and the etching gas was carbon fluoride with a flow rate of 100 sccm.

Next, a silicon nitride layer is formed as an insulating layer. As the deposition conditions, SiH₄, NH₃, nitrogen, and hydrogen were introduced at flow rates of 20 sccm, 220 sccm, 450 sccm, and 450 sccm, respectively; further, the pressure in the treatment chamber was set to 160 Pa, the substrate temperature was set to 250° C., and plasma discharge was performed at output of 200 W, whereby the silicon nitride layer with a thickness of 300 nm was formed.

Next, a resist was applied to the insulating layer and light exposure was performed using a fourth photomask. After that, development was performed, so that a resist mask was formed. With the use of the resist mask, the insulating layer was partly dry-etched so that the source and drain electrodes 133 were exposed. The insulating layer and the gate insulating layer 105 were partly dry-etched, so that the gate electrode 103 was exposed. After that, the resist mask was removed.

Through the above process, the thin film transistor was manufactured.

Figure 18:
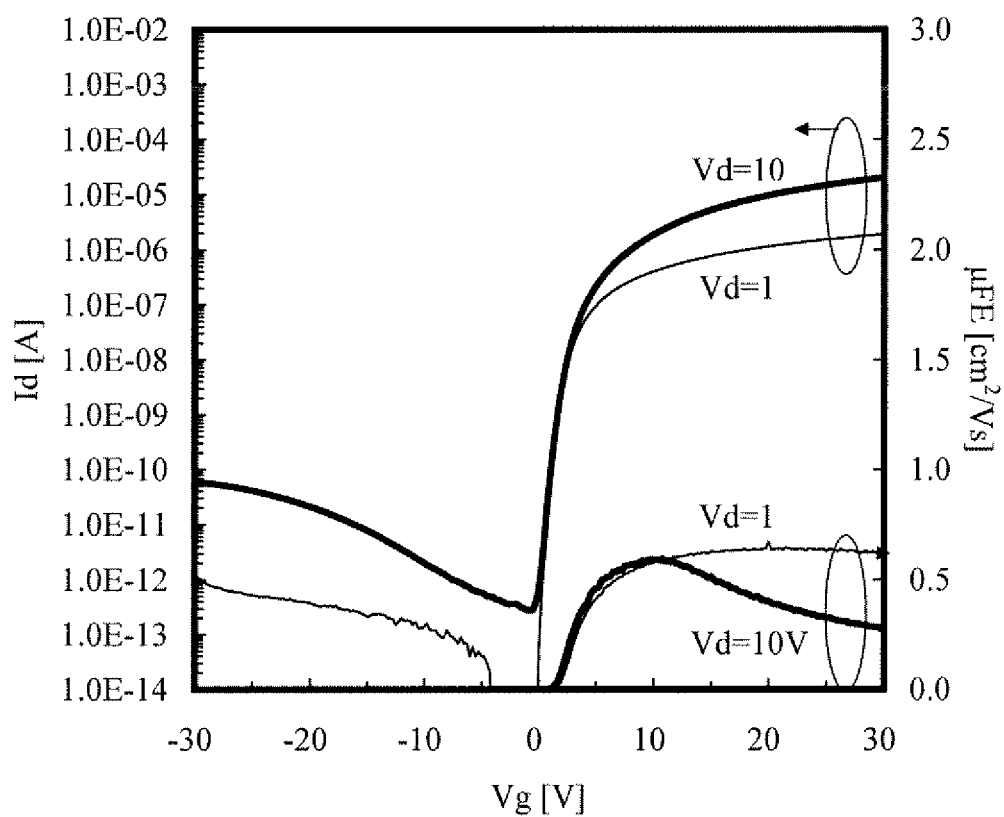
FIG. 18 is a graph showing a measurement result of electric characteristics of the thin film transistor.

FIG. 18 shows measurement results of electric characteristics of the thin film transistor. Solid lines show current-voltage characteristics and field-effect mobility in the case where drain voltages were 1 V and 10 V. Note that the thin film transistor of Example 3 was formed so as to have a channel length of 3.5 μm and a channel width of 20 μm.

Average values obtained by performing measurement of electric characteristics on sixteen thin film transistors are shown below. The threshold voltage (Vth) was 2.83 V, field-effect mobility was 0.65 cm²/Vs when Vd was 1 V and 0.59 cm²/Vs when Vd was 10 V, and the subthreshold swing was 0.46 V/dec. Further, when Vd was 10 V, on-current (Ion) was 5.13 μA and the minimum off-current (Ioff_min) was 0.31 pA at a voltage (Vg) of 15 V, and off-current (Ioff) was 9.6 pA at a voltage (Vg) of −14 V. Thus, a thin film transistor with favorable electric characteristics was manufactured, in which a shift in the threshold voltage was small, on-current was large, and off-current was small.

Example 4

In Example 4, presence of argon in source gases of a microcrystalline silicon layer, and an impurity contained in the microcrystalline silicon layer are described with reference to FIG. 19 and FIG. 20.

First, a method for manufacturing samples is described.

As a base layer, a silicon nitride layer was formed over a substrate. A silicon oxynitride layer was formed over the silicon nitride layer and then a microcrystalline silicon layer was formed over the silicon oxynitride layer. Next, as a protective layer, an amorphous silicon layer was formed over the microcrystalline silicon layer.

Here, as the substrate, a glass substrate (AN100 manufactured by Asahi Glass Co., Ltd.) was used.

As the deposition conditions of the silicon nitride layer, $SiH_4$, $H_2$, $N_2$, and $NH_3$ were introduced as source gases at flow rates of 40 sccm, 500 sccm, 550 sccm, and 140 sccm, respectively, and were stabilized; further, the pressure in the treatment chamber was set to 100 Pa, the substrate temperature was set to 280° C., and a plasma CVD method was conducted in which plasma discharge was performed using an RF power source frequency of 13.56 MHz and the power of an RF power source of 370 W.

Next, $SiH_4$ and $N_2O$ were introduced as source gases at flow rates of 30 sccm and 1200 sccm, respectively, and were stabilized; further, the pressure in the treatment chamber was set to 40 Pa, the substrate temperature was set to 280° C., and plasma discharge was performed at output of 50 W, whereby the silicon oxynitride layer (denoted as SiON in FIG. 19 and FIG. 20) was formed to a thickness of approximately 100 nm.

Then, the substrate was carried out of the treatment chamber of the plasma CVD apparatus, the inside of the treatment chamber was cleaned with $NF_3$, and then a silicon oxide layer as a protective film was formed in the treatment chamber.

Next, $SiH_4$, $H_2$, and argon were introduced as source gases at flow rates of 10 sccm, 1500 sccm, and 0 sccm or 1500 sccm, respectively, and were stabilized; further, the pressure in the treatment chamber was set to 280 Pa, the substrate temperature was set to 280° C., and plasma discharge was performed using an RF power source frequency of 13.56 MHz and power of an RF power source of 50 W, whereby a microcrystalline silicon layer (denoted as μc-Si in FIG. 19 and FIG. 20) was formed to a thickness of 100 nm by a plasma CVD method.

Then, as a protective layer, an amorphous silicon layer (denoted as a-Si in FIG. 19 and FIG. 20) with a thickness of 100 nm was formed over the microcrystalline silicon layer.

Figure 19:
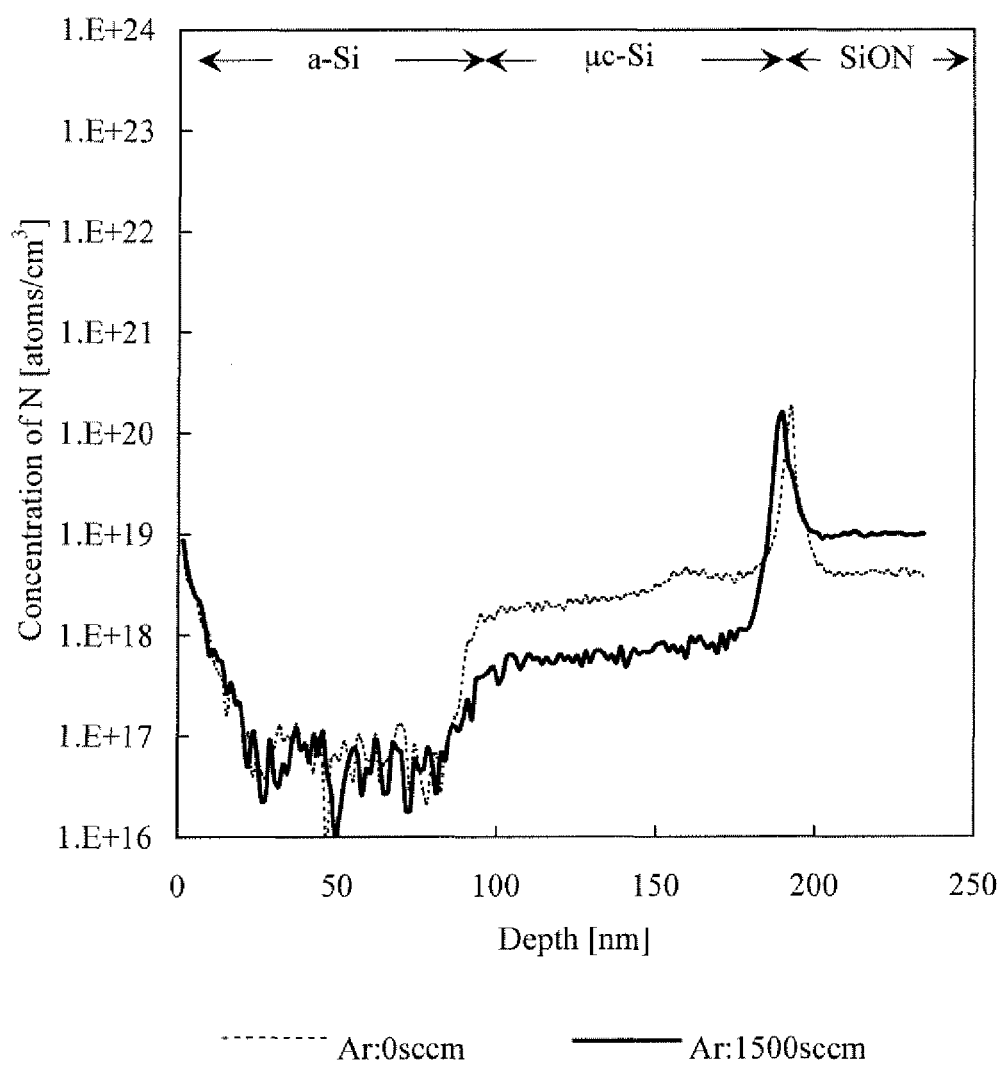
FIG. 19 is a graph showing the concentration of nitrogen contained in a microcrystalline silicon layer.
Figure 20:
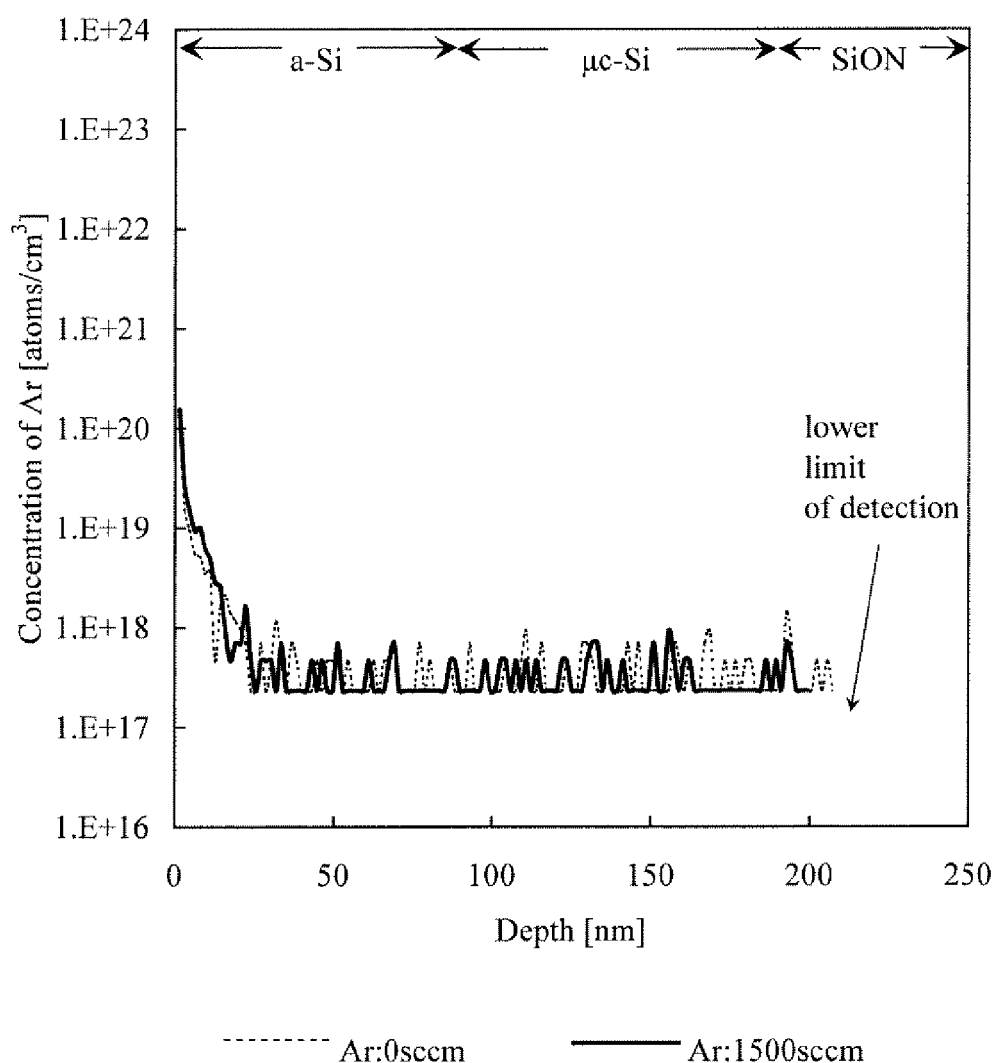
FIG. 20 is a graph showing the concentration of argon contained in a microcrystalline silicon layer.

FIG. 19 and FIG. 20 show the results obtained by measuring the samples by SIMS. FIG. 19 shows the nitrogen concentration and FIG. 20 shows the argon concentration. In FIG. 19 and FIG. 20, dashed lines indicate concentration profiles of the sample in which the flow rate of argon was 0 sccm in the source gases of the microcrystalline silicon layer, and solid lines indicate concentration profiles of the sample in which the flow rate of argon was 1500 sccm.

FIG. 19 shows that the nitrogen concentration of the microcrystalline silicon layer (μc-Si) is reduced when the flow rate of argon in the source gases is 1500 sccm. Accordingly, it is found that the impurity concentration of the microcrystalline silicon layer can be reduced with the use of argon as a source gas. On the other hand, FIG. 20 shows that the amount of argon contained in the microcrystalline silicon layer is less than the lower limit of the detection even when argon is used as the source gas. Accordingly, it is found that argon is not easily taken in the microcrystalline silicon layer although argon is used as a source gas.

This application is based on Japanese Patent Application serial no. 2008-293954 filed with Japan Patent Office on Nov. 17, 2008, the entire contents of which are hereby incorporated by reference.

What is claimed is:

1. A method for manufacturing a thin film transistor, comprising:
    forming a gate electrode over a substrate;
    forming a gate insulating layer over the gate electrode;
    forming a first semiconductor layer over the gate insulating layer by applying high frequency power using a first mixed gas containing hydrogen, a rare gas, and at least one of silicon and germanium;
    forming a second semiconductor layer including the first semiconductor layer and an amorphous semiconductor over the gate insulating layer by applying high frequency power using a second mixed gas containing hydrogen, a gas containing nitrogen, and at least one of silicon and germanium after forming the first semiconductor layer;
    forming an impurity semiconductor layer over the second semiconductor layer; and
    forming a conductive layer over the impurity semiconductor layer.

2. The method for manufacturing a thin film transistor according to claim 1, wherein the first semiconductor layer is a microcrystalline semiconductor layer.

3. The method for manufacturing a thin film transistor according to claim 1, wherein the second semiconductor layer comprises a microcrystalline semiconductor layer in contact with the gate insulating layer and a layer including a microcrystalline semiconductor and the amorphous semiconductor in contact with the microcrystalline semiconductor layer, and wherein the microcrystalline semiconductor layer includes at least a part of the first semiconductor layer.

4. The method for manufacturing a thin film transistor according to claim 3, wherein a concentration of nitrogen is $2 \times 10^{20}$ $cm^{-3}$ or more to $1 \times 10^{21}$ $cm^{-3}$ or less in the second semiconductor layer.

5. The method for manufacturing a thin film transistor according to claim 1, wherein the second semiconductor layer comprises a microcrystalline semiconductor layer in contact with the gate insulating layer, a layer including a microcrystalline semiconductor and the amorphous semiconductor in contact with the microcrystalline semiconductor layer, and an amorphous semiconductor layer in contact with the layer including the microcrystalline semiconductor and the amorphous semiconductor, and wherein the microcrystalline semiconductor layer includes at least a part of the first semiconductor layer.

6. The method for manufacturing a thin film transistor according to claim 1, wherein the second mixed gas further contains a second rare gas.

7. The method for manufacturing a thin film transistor according to claim 6, wherein the second rare gas is any one of helium, neon, argon, xenon, and krypton.

8. The method for manufacturing a thin film transistor according to claim 1, wherein the rare gas is any one of helium, neon, argon, xenon, and krypton.

9. The method for manufacturing a thin film transistor according to claim 1, wherein the gas containing nitrogen is any one of ammonia, nitrogen, nitrogen fluoride, and nitrogen chloride.

10. The method for manufacturing a thin film transistor according to claim 1, wherein the second semiconductor layer comprises a microcrystalline semiconductor formed by using the first semiconductor layer as a seed crystal.

11. The method for manufacturing a thin film transistor according to claim 1, further comprising a step of etching a part of the amorphous semiconductor so that the amorphous semiconductor has a depression.

12. The method for manufacturing a thin film transistor according to claim 1, further comprising a step of etching a part of the amorphous semiconductor so that the amorphous semiconductor has a depression portion with the amorphous semiconductor remained between the depression portion and the gate insulating layer.

13. A method for manufacturing a thin film transistor, comprising:
forming a gate electrode over a substrate;
forming a gate insulating layer over the gate electrode;
forming a first semiconductor layer over the gate insulating layer by applying high frequency power using a first mixed gas containing hydrogen, and a rare gas, and at least one of silicon and germanium;
forming a second semiconductor layer including the first semiconductor layer and an amorphous semiconductor over the gate insulating layer by applying high frequency power using a second mixed gas containing hydrogen, a gas containing nitrogen, and at least one of silicon and germanium after forming the first semiconductor layer;
forming an impurity semiconductor layer over the second semiconductor layer;
etching the second semiconductor layer and the impurity semiconductor layer;
forming a conductive layer;
forming a wiring by etching the conductive layer; and
forming source and drain regions by etching the etched impurity semiconductor layer formed by the step of etching the second semiconductor layer and the impurity semiconductor layer.

14. The method for manufacturing a thin film transistor according to claim 13, wherein the first semiconductor layer is a microcrystalline semiconductor layer.

15. The method for manufacturing a thin film transistor according to claim 13, wherein the second semiconductor layer comprises a microcrystalline semiconductor layer in contact with the gate insulating layer and a layer including a microcrystalline semiconductor and the amorphous semiconductor in contact with the microcrystalline semiconductor layer, and wherein the microcrystalline semiconductor layer includes at least a part of the first semiconductor layer.

16. The method for manufacturing a thin film transistor according to claim 15, wherein a concentration of nitrogen is $2\times10^{20}$ cm$^{-3}$ or more to $1\times10^{21}$ cm$^{-3}$ or less in the second semiconductor layer.

17. The method for manufacturing a thin film transistor according to claim 13, wherein the second semiconductor layer comprises a microcrystalline semiconductor layer in contact with the gate insulating layer, a layer including a microcrystalline semiconductor and the amorphous semiconductor in contact with the microcrystalline semiconductor layer, and an amorphous semiconductor layer in contact with the layer including the microcrystalline semiconductor and the amorphous semiconductor, and wherein the microcrystalline semiconductor layer includes at least a part of the first semiconductor layer.

18. The method for manufacturing a thin film transistor according to claim 13, wherein the second mixed gas further contains a second rare gas.

19. The method for manufacturing a thin film transistor according to claim 18, wherein the second rare gas is any one of helium, neon, argon, xenon, and krypton.

20. The method for manufacturing a thin film transistor according to claim 13, wherein the rare gas is any one of helium, neon, argon, xenon, and krypton.

21. The method for manufacturing a thin film transistor according to claim 13, wherein the gas containing nitrogen is any one of ammonia, nitrogen, nitrogen fluoride, and nitrogen chloride.

22. The method for manufacturing a thin film transistor according to claim 13, wherein the second semiconductor layer comprises a microcrystalline semiconductor formed by using the first semiconductor layer as a seed crystal.

23. The method for manufacturing a thin film transistor according to claim 13, further comprising a step of etching a part of the amorphous semiconductor so that the amorphous semiconductor has a depression.

24. The method for manufacturing a thin film transistor according to claim 13, further comprising a step of etching a part of the amorphous semiconductor so that the amorphous semiconductor has a depression portion with the amorphous semiconductor remained between the depression portion and the gate insulating layer.

25. A method for manufacturing a thin film transistor, comprising:
forming a gate electrode over a substrate; forming a gate insulating layer over the gate electrode;
forming a first semiconductor layer over the gate insulating layer by applying high frequency power using a first mixed gas containing hydrogen, a rare gas, and at least one of silicon and germanium;
forming a second semiconductor layer including the first semiconductor layer and an amorphous semiconductor over the gate insulating layer by applying high frequency power using a second mixed gas containing hydrogen, a gas containing nitrogen, and at least one of silicon and germanium after forming the first semiconductor layer;
forming an impurity semiconductor layer over the second semiconductor layer;
forming a conductive layer over the impurity semiconductor layer;
etching the second semiconductor layer, the impurity semiconductor layer, and the conductive layer;
forming a wiring by etching the etched conductive layer; and
forming source and drain regions by etching the etched impurity semiconductor layer formed by the step of etching the second semiconductor layer and the impurity semiconductor layer.

26. The method for manufacturing a thin film transistor according to claim 25, wherein the first semiconductor layer is formed using a microcrystalline semiconductor layer.

27. The method for manufacturing a thin film transistor according to claim 25, wherein the second semiconductor layer comprises a microcrystalline semiconductor layer in contact with the gate insulating layer and a layer including a microcrystalline semiconductor and the amorphous semiconductor in contact with the microcrystalline semiconductor layer, and wherein the microcrystalline semiconductor layer includes at least a part of the first semiconductor layer.

28. The method for manufacturing a thin film transistor according to claim 27, wherein a concentration of nitrogen is $2\times10^{20}$ cm$^{-3}$ or more to $1\times10^{21}$ cm$^{-3}$ or less in the second semiconductor layer.

29. The method for manufacturing a thin film transistor according to claim 25, wherein in the second semiconductor layer comprises a microcrystalline semiconductor layer in contact with the gate insulating layer, a layer including a microcrystalline semiconductor and the amorphous semiconductor in contact with the microcrystalline semiconductor layer, and an amorphous semiconductor layer in contact with the layer including the microcrystalline semiconductor and the amorphous semiconductor, and wherein the microcrystalline semiconductor layer includes at least a part of the first semiconductor layer.

30. The method for manufacturing a thin film transistor according to claim 25, wherein the second mixed gas further contains a second rare gas.

31. The method for manufacturing a thin film transistor according to claim 30, wherein the second rare gas is any one of helium, neon, argon, xenon, and krypton.

32. The method for manufacturing a thin film transistor according to claim 25, wherein the rare gas is any one of helium, neon, argon, xenon, and krypton.

33. The method for manufacturing a thin film transistor according to claim 25, wherein the gas containing nitrogen is any one of ammonia, nitrogen, nitrogen fluoride, and nitrogen chloride.

34. The method for manufacturing a thin film transistor according to claim 25, wherein the second semiconductor layer comprises a microcrystalline semiconductor formed by using the first semiconductor layer as a seed crystal.

35. The method for manufacturing a thin film transistor according to claim 25, further comprising a step of etching a part of the amorphous semiconductor so that the amorphous semiconductor has a depression.

36. The method for manufacturing a thin film transistor according to claim 25, further comprising a step of etching a part of the amorphous semiconductor so that the amorphous semiconductor has a depression portion with the amorphous semiconductor between the depression portion and the gate insulating layer.

* * * * *

UNITED STATES PATENT AND TRADEMARK OFFICE
CERTIFICATE OF CORRECTION

PATENT NO. : 8,569,120 B2
APPLICATION NO. : 12/617406
DATED : October 29, 2013
INVENTOR(S) : Erika Takahashi et al.

It is certified that error appears in the above-identified patent and that said Letters Patent is hereby corrected as shown below:

In the Specification:

Column 4, line 46, "ease" should read --case--

Column 5, line 51, "(TEOS: $Si(OC_2H_5)_4$" should read --(TEOS: $Si(OC_2H_5)_4$)--

Column 8, line 41, "PL, (photoluminescence)" should read --PL (photoluminescence)--

Column 9, line 31, "amorphous semiconductor layer 1081*b*." should read --amorphous semiconductor layer 108*b*.--

Column 14, line 40, "multi-level tight intensity," should read --multi-level light intensity,--

Column 18, line 56, "layer 1071) including" should read --layer 107*b* including--

Column 20, line 28, "$SiH, H_2$," should read --$SiH_4, H_2$,--

Column 22, line 19, "amorphous semiconductor layer 115*e*)" should read --amorphous semiconductor layer 115*c*)--

Column 29, line 31, "one of 0 scorn," should read --one of 0 sccm,--

Column 29, line 32, "1500 scorn, or 2000 sccm" should read --1500 sccm, or 2000 sccm--

Column 29, line 45, "argon of 1500 scorn," should read --argon of 1500 sccm--

Column 31, line 53, "a conductive layer 119" should read --a conductive layer 111--

Column 32, line 19, "semiconductor layer 129*e*" should read --semiconductor layer 129*c*--

In the Claims:

Claim 36, Column 37, line 30, "semiconductor between" should read --semiconductor remained between--

Signed and Sealed this
Eighteenth Day of February, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,569,120 B2
APPLICATION NO. : 12/617406
DATED : October 29, 2013
INVENTOR(S) : Takahashi et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 742 days.

Signed and Sealed this
Seventh Day of April, 2015

Michelle K. Lee
*Director of the United States Patent and Trademark Office*